(12) United States Patent
Machida et al.

(10) Patent No.: US 8,421,123 B2
(45) Date of Patent: Apr. 16, 2013

(54) SEMICONDUCTOR DEVICE HAVING TRANSISTOR AND RECTIFIER

(75) Inventors: Osamu Machida, Niiza (JP); Akio Iwabuchi, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 79 days.

(21) Appl. No.: 13/084,777

(22) Filed: Apr. 12, 2011

(65) Prior Publication Data
US 2011/0254056 A1 Oct. 20, 2011

(30) Foreign Application Priority Data

Apr. 16, 2010 (JP) ................................. 2010-095130

(51) Int. Cl.
*H01L 29/778* (2006.01)
(52) U.S. Cl.
USPC ........... 257/195; 257/192; 257/193; 257/194; 257/173; 257/E29.246
(58) Field of Classification Search .......... 257/192–195, 257/173, E29.246
See application file for complete search history.

(56) References Cited

U.S. PATENT DOCUMENTS

| 7,498,617 B2 | 3/2009 | Kinzer | |
| 2009/0206363 A1 * | 8/2009 | Machida et al. | 257/133 |

* cited by examiner

*Primary Examiner* — Tran Tran
(74) *Attorney, Agent, or Firm* — Oblon, Spivak, McClelland, Maier & Neustadt, L.L.P.

(57) ABSTRACT

A semiconductor device having a transistor and a rectifier includes: a current path; a first main electrode having a rectifying function and arranged on one end of the current path; a second main electrode arranged on the other end of the current path; an auxiliary electrode arranged in a region of the current path between the first main electrode and the second main electrode; a third main electrode arranged on the one end of the current path apart from the first main electrode along a direction intersecting the current path; and a control electrode arranged in a region of the current path between the second main electrode and the third main electrode. The transistor includes the current path, the second main electrode, the third main electrode, and the control electrode. The rectifier includes the current path, the first main electrode, the second main electrode, and the auxiliary electrode.

8 Claims, 18 Drawing Sheets

SEMICONDUCTOR DEVICE HAVING TRANSISTOR AND RECTIFIER

BACKGROUND OF THE INVENTION

1. Field of the Invention

The present invention relates to a semiconductor device having a transistor and a rectifier.

2. Description of the Related Art

In recent years, a high electron mobility transistor (HEMT) using a gallium nitride (GaN)-based compound semiconductor has been used frequently. The GaN-based HEMT has a low resistance value and a high breakdown voltage, and accordingly, is frequently used for use in electric power, and specifically, for a power supply circuit.

By Kinzer (U.S. Pat. No. 7,498,617 B2), a HEMT is disclosed, which includes an antiparallel diode that prevents noise of an opposite polarity voltage by introducing a reverse current. The HEMT disclosed by Kinzer has an object to prevent damage and breakage of the HEMT, which result from the noise of the opposite polarity voltage, by adding the antiparallel diode.

The HEMT disclosed by Kinzer has heterojunction in which a first group III nitride semiconductor (GaN) and a second group III compound semiconductor (AlGaN) are stacked on a support body. The HEMT includes a first power supply electrode (source electrode) and a second power supply electrode (drain electrode), which are spaced apart from each other on the second group III compound semiconductor, and includes a gate structure between the first power supply electrode and the second power supply electrode. A diode (defined as a first diode) includes a cathode electrode allowed to also serve as the second power supply electrode (drain electrode) of the HEMT, and a Schottky electrode arranged apart from the cathode electrode on an opposite side with the gate structure. That is to say, a structure in which a function like a body diode is added to the HEMT is adopted. In the case of premising a GaN-based semiconductor device having a high-speed operation and a high withstand voltage, a high-speed operation is also required for the diode. Accordingly, a Schottky barrier diode using the Schottky electrode as an anode electrode is adopted for the first diode.

Moreover, Kinzer also discloses a HEMT to which a diode (defined as a second diode) having another structure than that described above is added. In a similar way to the first diode, the second diode includes a cathode electrode allowed to also serve as a second power supply electrode (drain electrode), and a Schottky electrode arranged between a cathode electrode and a gate structure. The second diode is a Schottky barrier diode in a similar way to the first diode.

However, in the first diode added to the former HEMT, though the cathode electrode is allowed to also serve as the second power supply electrode of the HEMT, the Schottky electrode (anode electrode) is arranged on another region than such a HEMT region. The first diode having such a structure has a current path independently of the HEMT. Therefore, the structure and performance of each of the HEMT and the first diode can be optimally set, and a degree of freedom in designing and fabricating the same is brought about. However, the region of the HEMT and the region of the first diode are required separately from each other, and accordingly, the former HEMT is inferior in area utilization efficiency of the semiconductor device.

Meanwhile, in the second diode added to the latter HEMT, the cathode electrode is allowed to also serve as the second power supply electrode, and the Schottky electrode is arranged on the region of the HEMT. Accordingly, the latter HEMT is superior in area utilization efficiency. However, a part of a current path of the HEMT is used as a current path of the second diode, and accordingly, it is difficult to achieve reduction of forward voltage of the second diode without deteriorating characteristics of the HEMT, and less flexibility in designing and fabricating the same is brought about.

SUMMARY OF THE INVENTION

A semiconductor device, which has a transistor and a rectifier, according to a first aspect of the present invention includes: a current path; a first main electrode having a rectifying function and arranged on one end of the current path; a second main electrode arranged on the other end of the current path; an auxiliary electrode arranged in a region of the current path between the first main electrode and the second main electrode; a third main electrode arranged on the one end of the current path apart from the first main electrode along a direction intersecting the current path; and a control electrode arranged in a region of the current path between the second main electrode and the third main electrode. The transistor includes the current path, the second main electrode, the third main electrode, and the control electrode. The rectifier includes the current path, the first main electrode, the second main electrode, and the auxiliary electrode.

DETAILED DESCRIPTION OF THE EMBODIMENTS

Figure 1:
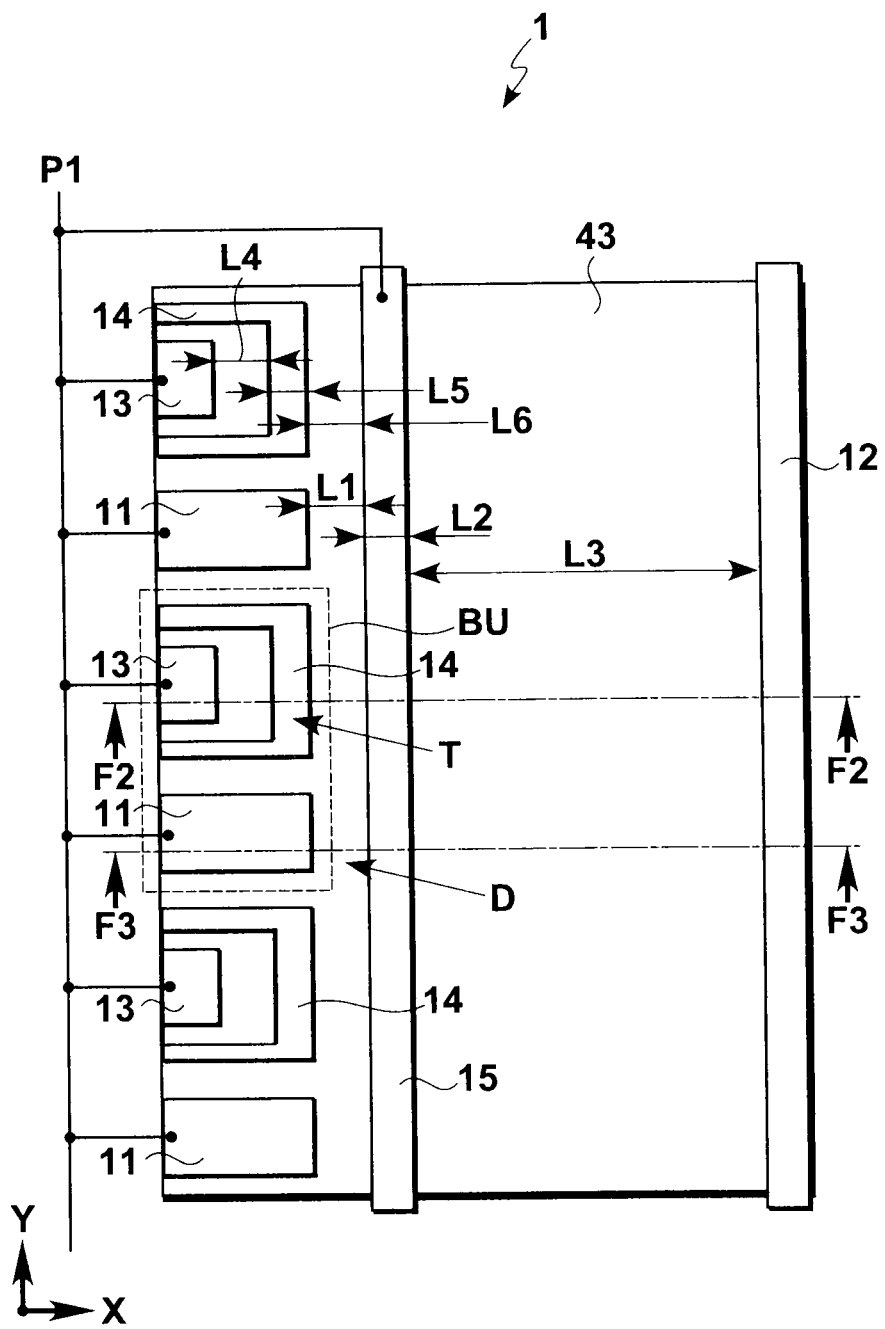
FIG. 1 is a plan view of main portions of a semiconductor device according to a first embodiment.

A description is made below of embodiments of the present invention with reference to the drawings.

In the following description referring to the drawings, the same or similar reference numerals are assigned to the same or similar portions. However, the drawings are schematic and different from the actual ones. Moreover, also among the drawings, there are sometimes included portions in which dimensional relationships and ratios are different from one another.

Moreover, the embodiments described below illustrate devices and methods for embodying the technical idea of the present invention, and the technical idea of this invention does not specify arrangement and the like of the respective constituent components to those described below. The technical idea of the present invention can add a variety of alterations within the scope of claims.

First Embodiment

A first embodiment describes an example where the present invention is applied to a semiconductor device, in which HEMT is used as transistor, and Schottky barrier diode is used as rectifier added to the HEMT.

[Device Structure of Semiconductor Device]

Figure 2:
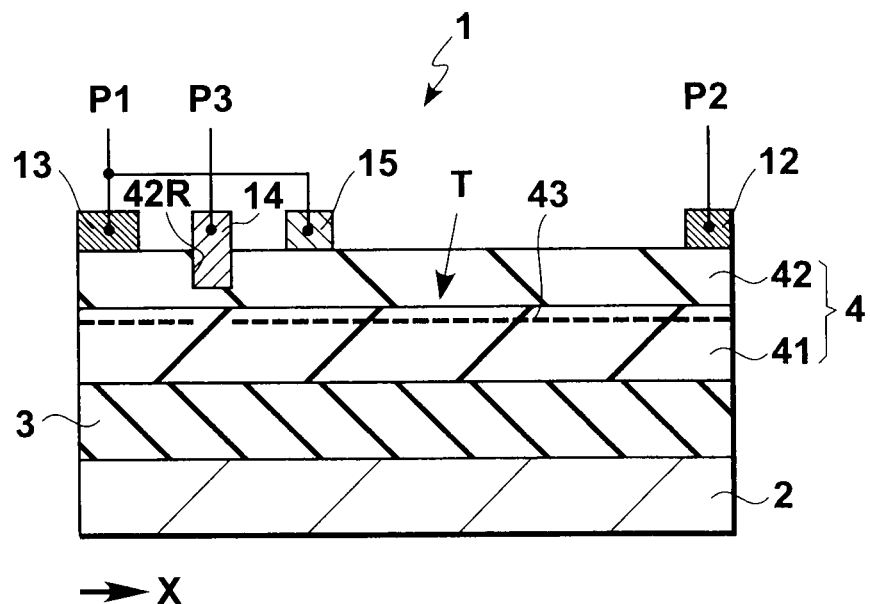
FIG. 2 is a schematic cross-sectional view of a transistor of the semiconductor device cut along a line F2-F2 illustrated in FIG. 1.
Figure 3:
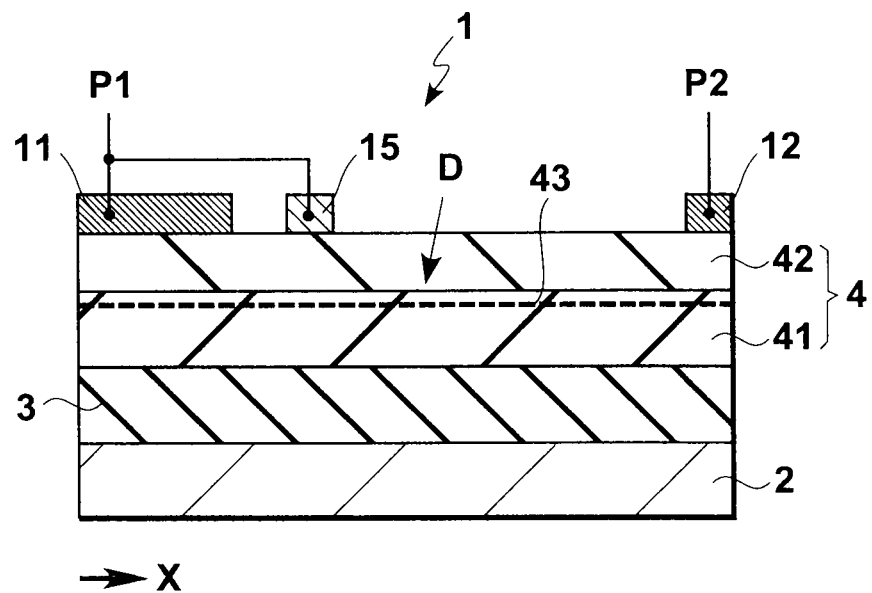
FIG. 3 is a schematic cross-sectional view of a rectifier of the semiconductor device cut along a line F3-F3 illustrated in FIG. 1.

As illustrated in FIGS. 1 to 3, a semiconductor device 1 according to the first embodiment is a device in which the transistor T and the rectifier D are formed integrally with each other, and includes a current path 43, first main electrodes 11, a second main electrode 12, an auxiliary electrode 15, third main electrodes 13, and control electrodes 14. The first main electrodes 11 have a rectifying function, and are arranged on one end of the current rout 43 (that is, on a left side of the semiconductor device 1 in FIGS. 1 to 3). The second main electrode 12 is arranged on the other end of the current path 43 (that is, on a right side of the semiconductor device 1 in FIGS. 1 to 3). The auxiliary electrode 15 has the rectifying function, has a forward voltage larger in comparison with the first main electrodes 11, and is arranged in a region of the current path 43 between the first main electrodes 11 and the second main electrode 12. The third main electrodes 13 are arranged apart from the first main electrodes 11 in a direction intersecting the current path 43 on the one end of the current path 43. Each of the control electrodes 14 is arranged so as to enclose a periphery of each of the third main electrodes 13. Then, the transistor T includes the current path 43, the second main electrode 12, the third main electrodes 13, and the control electrodes 14. Moreover, the rectifier D includes the current path 43, the first main electrodes 11, the second main electrode 12, and the auxiliary electrode 15.

Here, in the first embodiment, with regard to the transistor T and the rectifier D, which are mounted on the semiconductor device 1, the transistor T is n-channel conduction-type HEMT, and the rectifier D is Schottky barrier diode (SBD).

The semiconductor device 1 uses, as a base, a substrate 2 to be used as a support body and a crystal growing substrate. On the substrate 2, a buffer layer 3 and a semiconductor function layer 4 are sequentially stacked and arranged. In the first embodiment, a monocrystalline silicon semiconductor substrate (Si substrate) is used for the substrate 2; however, without being limited to this example, for example, a sapphire substrate, a silicon carbide substrate (SiC substrate), a GaN substrate and the like can be used.

The buffer layer 3 has a function to match crystallinity of the substrate 2 and that of the semiconductor function layer 4 with each other. In the first embodiment, the buffer layer 3 is composed of a group III nitride-based semiconductor material. A typical group III nitride-based semiconductor is represented by: $Al_xIn_yGa_{1-x-y}N$ ($0 \leq x \leq 1$, $0 \leq y \leq 1$, $0 \leq x+y \leq 1$). In the first embodiment, a composite film in which pluralities of GaN layers and AlN layers are alternately stacked is used as the buffer layer 3; however, the buffer layer 3 is not limited to this structure.

In the first embodiment, the semiconductor function layer 4 is composed of a stack structure of a first semiconductor layer 41 stacked on the buffer layer 3, and of a second semiconductor layer 42 stacked on the first semiconductor layer 41. The first semiconductor layer 41 is composed of a nitride-based semiconductor layer, and specifically, of a GaN layer. The first semiconductor layer 41 functions as a carrier travel layer. In the first embodiment, the n-channel conduction-type HEMT is used for the transistor T, and accordingly, carriers are electrons. Therefore, the first semiconductor layer 41 functions as an electron travel layer. The second semiconductor layer 42 is composed of a nitride-based semiconductor layer, and specifically, of an AlGaN layer having a lattice constant smaller than a lattice constant of the first semiconductor layer 41 and having a band gap larger than a band gap of the first semiconductor layer 41. The second semiconductor layer 42 functions as a carrier supply layer, and functions as an electron supply layer in the first embodiment.

In the vicinity of heterojunction between the first semiconductor layer 41 and the second semiconductor layer 42, the current path 43 is generated in the first semiconductor layer 41. In the first embodiment, the current path 43 is a two-dimensional carrier gas channel, and specifically, a two-dimensional electron gas (2DEG) channel. In FIGS. 1 to 3, the current path 43 is extended from the left side to the right side along an X-direction. The current path 43 functions as a channel region where the current (or electrons or holes) flow along the X-direction or reversely thereto. Here, in the first embodiment, the direction intersecting the current path 43 (or an extended direction thereof) indicates a Y-direction orthogonal to the X-direction; however, the direction concerned is not limited to this Y-direction, and may be a direction intersecting the X-direction at an acute or obtuse angle.

In the first embodiment, a film thickness of the first semiconductor layer 41 for use in the semiconductor device 1 is set, for example, at 500 nm to 10,000 nm; however, is not necessarily limited to this numeric value. Here, the GaN layer is used for the first semiconductor layer 41, and a film thickness of the GaN layer is set, for example, at 2,500 nm to 3,500 nm. Moreover, a film thickness of the AlGaN layer of the second semiconductor layer 42 is set, for example, at 5 nm to 100 nm.

[Device Structure of Rectifier]

As illustrated in FIGS. 1 and 3, each of the first main electrodes 11 of the semiconductor device 1 has a function as an anode electrode of the rectifier D, and is electrically connected to the one end of the current path 43 while forming a Schottky barrier. For an electrode material of the first main electrode 11, which forms the Schottky barrier, for example, there can be used a stack film of a Ni layer having a film thickness of 10 nm to 50 nm, and of an Au layer stacked on the Ni layer and having a film thickness, for example, of 100 nm to 1000 nm.

As illustrated in FIG. 1, a planar shape of the first main electrode 11 is composed of a rectangular shape in which a side in the X-direction is set longer than a side in the Y-direction; however, is not limited to this planer shape. In order to miniaturize the semiconductor device 1, it is preferable to shorten a distance between each of the first main electrodes 11 and the auxiliary electrode 15. The planar shape of the first main electrode 11 may be set at a square shape, a polygonal shape equal to or more than a pentagon, a circular shape, an ellipsoidal shape or the like according to needs.

The second main electrode 12 is a cathode electrode of the rectifier D, and is electrically connected to the other end of the current path 43 by ohmic contact. For an electrode material of the second main electrode 12, which forms ohmic contact, for example, there can be used a stack film of a Ti layer having a film thickness of 10 nm to 50 nm, and of an Al layer stacked on the Ti layer and having a film thickness, for example, of 100 nm to 1000 nm. As illustrated in FIG. 1, a planar shape of the second main electrode 12 is composed of a stripe shape in which a longitudinal dimension in the Y-direction is set longer than a width dimension in the X-direction.

As mentioned above, the auxiliary electrode 15 has the forward voltage larger in comparison with the forward voltages of the first main electrodes 11, and in addition, has a leak current lower in comparison with leak currents of the first main electrodes 11. In other words, the auxiliary electrode 15 has characteristics in which, when a potential of either one of the second main electrode 12 and a set of the first main electrodes 11 and the auxiliary electrode 15 is set relatively higher, a current flowing through the auxiliary electrode 15 becomes smaller than a current flowing through the first main electrodes 11. The auxiliary electrode 15 is electrically connected (short circuited) to the first main electrodes 11, and the auxiliary electrode 15 and the first main electrodes 11 are set at the same potential. The transistor T is the n-channel conduction-type HEMT, and the current path 43 is the two-dimensional electron gas channel. Therefore, the auxiliary electrode 15 is composed of, for example, a p-type semiconductor electrode having the above-described characteristics or a metal-insulator-semiconductor (MIS)-type electrode.

As illustrated in FIG. 1, a planar shape of the auxiliary electrode 15 is composed of a stripe shape in which a longitudinal dimension in the Y-direction is set longer than a width dimension in the X-direction. A direction where the auxiliary electrode 15 is extended (Y-direction) is the same direction as a direction where the second main electrode 12 is extended (Y-direction). Moreover, the auxiliary electrode 15 and the second main electrode 12 are arranged in parallel to each other. Though sizes in an example will be described later, a clearance between the auxiliary electrode 15 and the second main electrode 12 in the X-direction is set larger in comparison with a clearance between the auxiliary electrode 15 and the first main electrodes 11 (or the control electrodes 14) in order to ensure a withstand voltage.

[Device Structure of Transistor]

Each of the third main electrodes 13 is a source electrode of the transistor T, and is electrically connected to the one end of the current path 43 by the ohmic contact. The third main electrodes 13 are electrically connected (short circuited) to the auxiliary electrode 15, and the third main electrodes 13 and the auxiliary electrode 15 are set at the same potential. The auxiliary electrode 15 and the first main electrodes 11 are electrically connected to each other, and accordingly, the third main electrodes 13, the first main electrodes 11, and the auxiliary electrode 15 are set at the same potential. In the first embodiment, the third main electrodes 13 are composed of the same electrode material as that of the second main electrode 12. Moreover, the third main electrodes 13 and the second main electrode 12 are formed by the same step in a manufacturing process. As illustrated in FIG. 1, a planar shape of each of the third main electrodes 13 is composed of a rectangular shape in which a side in the X-direction is set shorter than a side in the Y-direction, which is opposite to the auxiliary electrode 15; however, is not limited to this example in a similar way to the planar shape of each of the first main electrodes 11.

Each of the control electrodes 14 is a gate electrode of the transistor T, and is arranged on a surface of the second semiconductor layer 42 in the current path 43 with Schottky contact. Between the one end and the other end of the current path 43, and in detail, among the third main electrodes 13, the auxiliary electrode 15, and further, the first main electrodes 11, each of the control electrodes 14 is arranged so as to enclose the periphery of each of the third main electrodes 13. Each of the control electrodes 14 is composed of a composite film, for example, including a Ni layer and an Au layer stacked on the Ni layer, which are capable of generating the Schottky barrier. In the first embodiment, a recess structure is adopted for the control electrodes 14; however, the control electrodes 14 are not limited to this structure. At least a part of each control electrode 14 is arranged in a recess (dent or recessed portion) 43R formed along a depth direction from the surface of the second semiconductor layer 42. The transistor T has normally-off characteristics. A threshold voltage Vth of the transistor T is set, for example, at 1.0V in the first embodiment.

The second main electrode 12 has a function as the cathode electrode of the rectifier D; however, originally has a function as a drain electrode of the transistor T. That is to say, the cathode electrode of the rectifier D is composed by using the drain electrode of the transistor T.

Note that in FIGS. 1 to 3 and the respective drawings to be used below, the semiconductor device 1, the rectifier D, and the transistor T are individually drawn schematically, and in actual, an insulating film, a protection film, a via hole and the like are composed on the second semiconductor layer 42. Here, illustration and description of the insulating film and the like are omitted so as to make it possible to clarify the structure and to facilitate the understanding.

[Layout Structure of Semiconductor Device]

As illustrated in FIG. 1, in the first embodiment, one of the first main electrodes (anode electrode of the rectifier D) 11, one of the third main electrodes (source electrode of the transistor T) 13 and one of the control electrodes 14 construct a base unit BU serving as a repeating unit. A plurality of base units BU are repeatedly arrayed along the Y-direction while having a fixed pitch. The second main electrode 12 and the auxiliary electrode 15 are used as electrodes common to the plurality of base units BU.

That is to say, a plurality of rectifiers D with the same structure, one of which is composed of the base unit BU, are constructed by being electrically connected in parallel to one another. In a similar way, a plurality of transistors (HEMTs) T with the same structure, one of which is composed of the base unit BU, are constructed by being electrically connected in parallel to one another. One of the rectifiers D composed of the base unit BU and one of the transistors T composed of the base unit BU are alternately arrayed along the Y-direction.

Between the first main electrodes 11 composed of the base units BU and the auxiliary electrode 15, the current path 43 functions as a current path of the rectifier D. Moreover, between the third main electrodes 13 composed of the base units BU and the auxiliary electrode 15 interposing the control electrodes 14 therewith, the current path 43 functions as a current path of the transistor T. Between the auxiliary electrode 15 and the second main electrode 12, the current path 43 functions as the current path of the rectifier D, and in addition, functions as the current path of the transistor T, and thereby functions as a current path shared by both of the rectifier D and the transistor T.

Here, numeric values are varied depending on a usage purpose of the product, rules of the manufacturing process, and the like, and are not limited to numeric values illustrated below; however, examples of the respective dimensions of main portions of the semiconductor device 1, which are considered to be the optimum at the present stage, are as follows.

A dimension L1 between the first main electrodes 11 and the auxiliary electrode 15 is set, for example, at 1 μm. A width dimension L2 of the auxiliary electrode 15 is set, for example, at 2 μm. A dimension (dimension of a drift region) L3 between the auxiliary electrode 15 and the second main electrode 12 is set, for example, at 10 μm. A dimension L4 between the third main electrodes 13 and the control electrodes 14 is set, for example, at 1 μm. A width dimension (gate length dimension) L5 of the control electrodes 14 is set, for example, at 1 μm. A dimension L6 between the control electrodes 14 and the auxiliary electrode 15 is set, for example, at 1 μm.

Such a repetition pitch of the base units BU is, for example, 5 μm to 10 μm. If the pitch among the base units BU is further reduced, then expansion of the current can be promoted between the auxiliary electrode 15 and the second main electrode 12 (in a drift region).

[Operations of Semiconductor Device]

Figure 4:
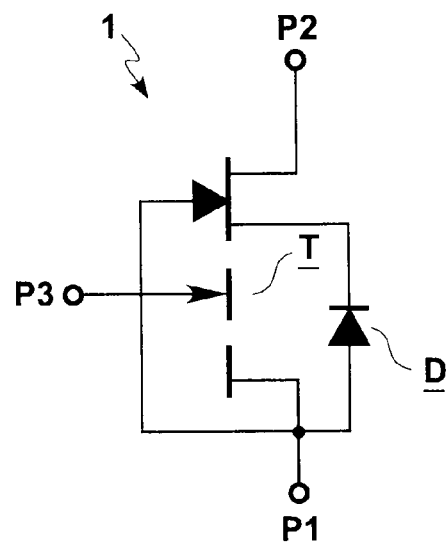
FIG. 4 is an equivalent circuit diagram of a whole of the semiconductor device illustrated in FIG. 2, including the transistor and the rectifier.

In the semiconductor device 1 according to the first embodiment, as illustrated in FIG. 4, to a terminal P1, there are connected each of the first main electrodes (anode electrode of the rectifier D) 11, the auxiliary electrode 15, and each of the third main electrodes (source electrode of the transistor T) 13. Then, to a terminal P2, there is connected the second main electrode (cathode electrode of the rectifier D and drain electrode of the transistor T) 12. Moreover, to a terminal P3, there is connected each of the control electrodes 14 (gate electrode of the transistor T). That is to say, the transistor T has a configuration to which a function like a body diode is added. An operation mechanism of the semiconductor device 1 is as follows.

(1) Operation in Reverse Voltage Application State

In a reverse voltage application state of the semiconductor device 1, in the transistor T illustrated in FIG. 4, an off-signal is applied to the control electrode (gate electrode of the transistor T) 14 through the terminal P3, and a voltage higher than a voltage applied to the second main electrode (drain electrode of the transistor T) 12 through the terminal P2 is applied to the third main electrode (source electrode of the transistor T) 13 through the terminal P1. At this time, as illustrated by using arrows in FIGS. 5 and 6, a reverse conduction current ib flows to the second main electrode (cathode electrode of the rectifier D) 12 though the current path 43 from each of the first main electrodes (anode electrode of the rectifier D) 11 having the forward voltage lower than the forward voltage of the auxiliary electrode 15.

Figure 5:
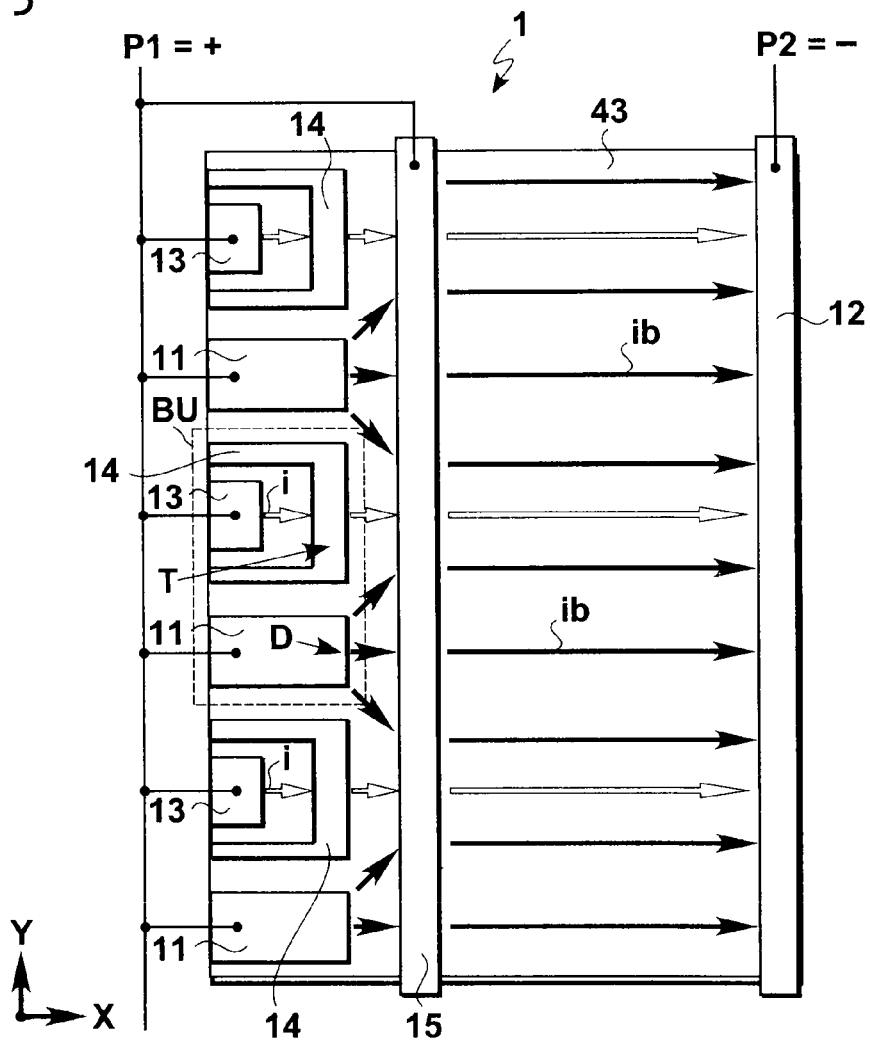
FIG. 5 is a plan view of main portions, illustrating flows of a current in a state where a reverse voltage is applied to the semiconductor device illustrated in FIG. 1.
Figure 6:
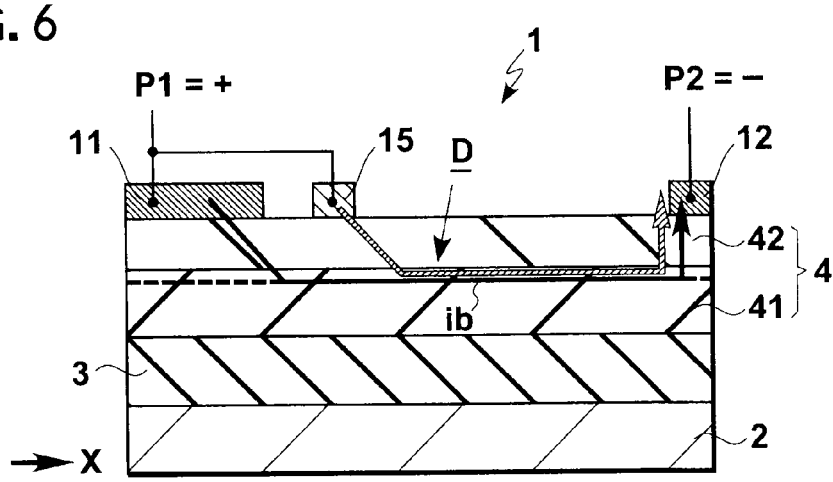
FIG. 6 is a schematic cross-sectional view illustrating the flow of the current in the state where the reverse voltage is applied to the semiconductor device illustrated in FIG. 1.

As illustrated in FIG. 5, though the reverse conduction current ib has some expansion, a region of the current path 43 between the first main electrodes 11 and the auxiliary electrode 15 functions as a current path of the rectifier D, roughly excluding regions between the third main electrodes 13 and the auxiliary electrode 15. In a region of the current path 43 between the auxiliary electrode 15 and the second main electrode 12, the reverse conduction current ib that has expanded from the first main electrodes 11 to the auxiliary electrode 15 further expands, and the reverse conduction current ib flows through the roughly entire region concerned. As described above, the region of the current path 43 between the auxiliary electrode 15 and the second main electrode 12 functions as the current path of the rectifier D.

In the case where an on-signal is applied to the control electrodes 14 through the terminal P3, as illustrated by using arrows in FIG. 5, a current i flows to the second main electrode (drain electrode of the transistor T) 12 through the current path 43 from each of the third main electrodes (source electrode of the transistor T) 13. At this time, a region of the current path 43 between the third main electrodes 13 and the auxiliary electrode 15 functions as a current path of the transistor T, roughly excluding regions between the first main electrodes 11 and the auxiliary electrode 15. A region of the current path 43 between the auxiliary electrode 15 and the second main electrode 12 functions as the current path of the transistor T, and is allowed to also serve as the current path of the rectifier D.

(2) Operation in Forward Voltage Application State

In a forward voltage application state of the semiconductor device 1, in the transistor T illustrated in FIG. 4, the off-signal is applied to the control electrode 14 through the terminal P3, and a voltage higher than a voltage applied to the third main electrode (source electrode of the transistor T) 13 through the terminal P1 is applied to the second main electrode (drain electrode of the transistor T) 12 through the terminal P2. At this time, a large field is applied to an end portion of the auxiliary electrode 15 on the second main electrode 12 side, and an amount of the leak current of the rectifier D is substantially determined by characteristics of the auxiliary electrode 15. Only a relatively small field is applied to each of end portions of the first main electrodes (anode electrode of the rectifier D) 11 on the second main electrode 12 side, and accordingly, the leak current is small in the first main electrodes 11. A function to flow the forward voltage is not required for the auxiliary electrode 15, and a structure and an electrode material, in which priority is given to measures against the leak current, can be selected for the auxiliary electrodes 15.

Figure 7:
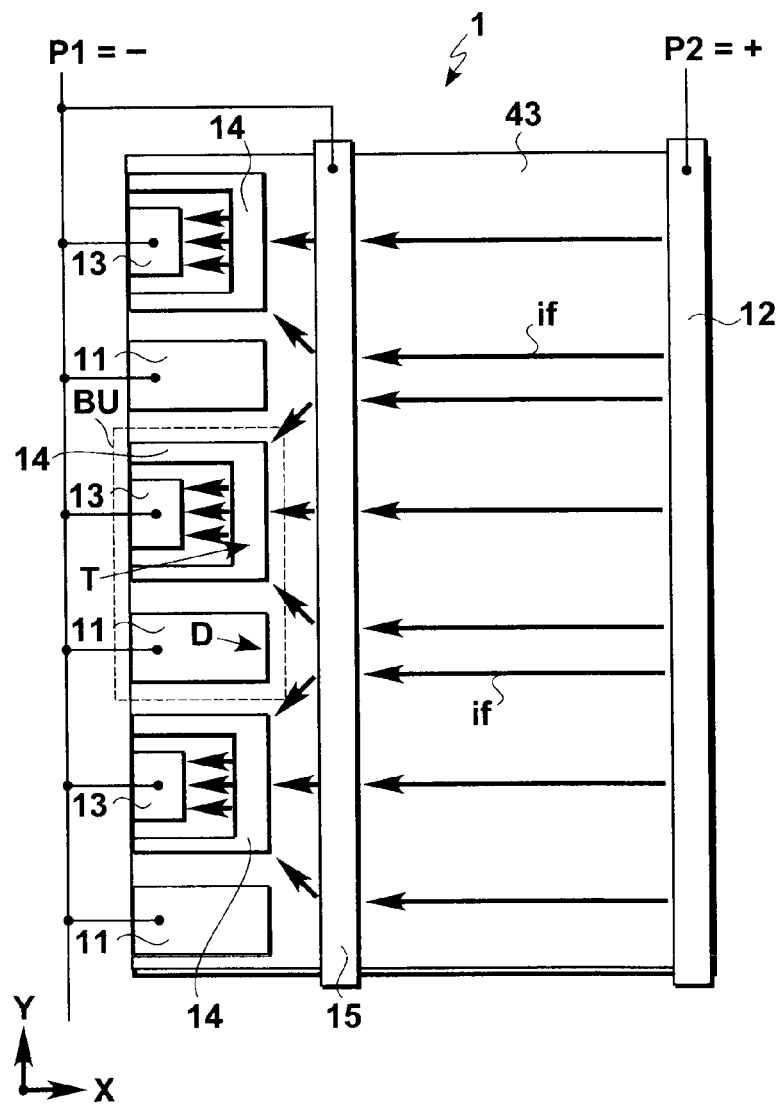
FIG. 7 is a plan view of main portions, illustrating flows of the current in a state where a forward voltage is applied to the semiconductor device illustrated in FIG. 1.

Note that, in the case where the on-signal is applied to each of the control electrodes 14 through the terminal P3, as illustrated by using arrows in FIG. 7, a current if flows to the third main electrodes (source electrode of the transistor T) 13 through the current path 43 from the second main electrode (drain electrode of the transistor T) 12. At this time, a region of the current path 43 between the third main electrodes 13 and the auxiliary electrode 15 functions as a current path of the transistor T, roughly excluding the regions between the first main electrodes 11 and the auxiliary electrode 15. The region of the current path 43 between the auxiliary electrode 15 and the second main electrode 12 functions as the current path of the transistor T.

Moreover, since the Schottky electrode is used for each of the first main electrodes (anode electrode of the rectifier D) 11, a diode-like operation becomes a unipolar operation. Hence, in comparison with such a body diode-like device as a silicon MOSFET and a silicon FRD, the semiconductor device 1 according to the first embodiment is superior in reverse recovery characteristics of the rectifier D.

[Features of First Embodiment]

As mentioned above, on the one end side of the current path 43 (that is, the region from the one end of the current path 43 to the auxiliary electrode 15), the semiconductor device 1 according to the first embodiment includes the third main electrodes (source electrode of the transistor T) 13, the control electrodes 14, and the first main electrodes (anode electrode of the rectifier D) 11. Moreover, the semiconductor device 1 has a structure, in which the first main electrode 11 and the third main electrode 13 enclosed by the control electrode 14 are alternately arrayed for two or more periods in the direction intersecting the current path 43 on the one end concerned, and the second main electrode (drain electrode of the transistor T, cathode electrode of the rectifier D, and further, drift region) is provided on the other end side of the current path 43 (that is, the region from the auxiliary electrode 15 to the other end of the current path 43). Hence, in the transistor T, the characteristics thereof can be enhanced independently of the rectifier D, and in the rectifier D, the reduction of the forward voltage thereof can be achieved separately from the characteristics of the transistor T. Moreover, since a part of the current path 43 can be shared between the transistor T and the rectifier D, the area utilization efficiency can be enhanced.

Second Embodiment

A second embodiment of the present invention describes an example where, in the semiconductor device 1 according to the above-mentioned first embodiment, the reduction of the forward voltage of the rectifier D is further promoted.

[Device Structure of Semiconductor Device]

Figure 8:
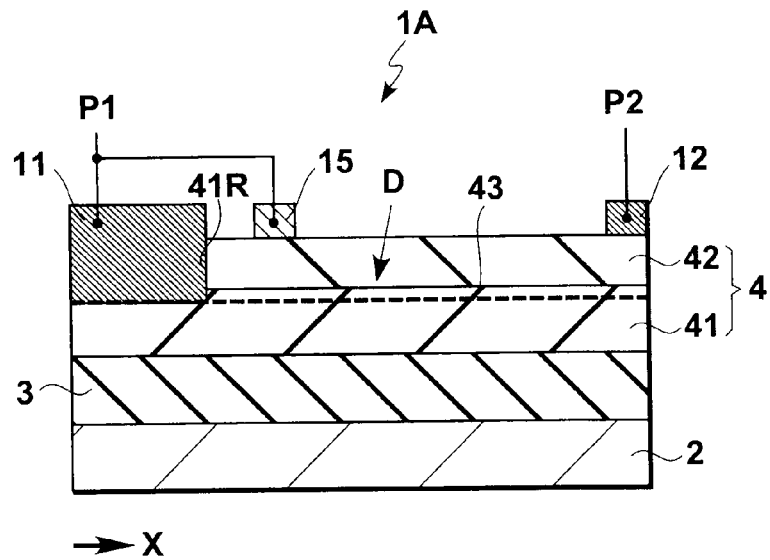
FIG. 8 is a schematic cross-sectional view of a rectifier of a semiconductor device according to a second embodiment.

In a semiconductor device 1A according to the second embodiment, which is illustrated in FIG. 8, planar structures of the transistor T and the rectifier D are substantially the same as planar structures of the transistor T and the rectifier D in the semiconductor device 1 according to the above-mentioned first embodiment. Moreover, a cross-sectional structure of the transistor T is also substantially the same as a cross-sectional structure of each of the transistor T of the semiconductor device 1 according to the above-mentioned first embodiment. The semiconductor device 1A according to the second embodiment is different from the semiconductor device 1 in cross-sectional structure of the rectifier D.

As illustrated in FIG. 8, in the semiconductor device 1A according to the second embodiment, each of the first main electrodes (anode electrode of the rectifier D) 11 is arranged in a recess 41R that reaches at least the current path 43 of the first semiconductor layer 41 from the surface (principal surface) of the second semiconductor layer 42, and is electrically connected to the current path 43 while directly making Schottky contact therewith. It is sufficient if a position of a bottom surface of the recess 43 is basically at a depth reaching the current path 43; however, may be set further deeper than a depth of the current path 43.

In the semiconductor device 1A according to the second embodiment, which is configured as described above, the reduction of the forward voltage can be further achieved in addition to effects obtained by the semiconductor device 1 according to the first embodiment.

Third Embodiment

A third embodiment of the present invention describes an example where the reduction of the forward voltage of the rectifier D is further promoted in a similar way to the semiconductor device 1A according to the above-mentioned second embodiment.

[Device Structure of Semiconductor Device]

Figure 9:
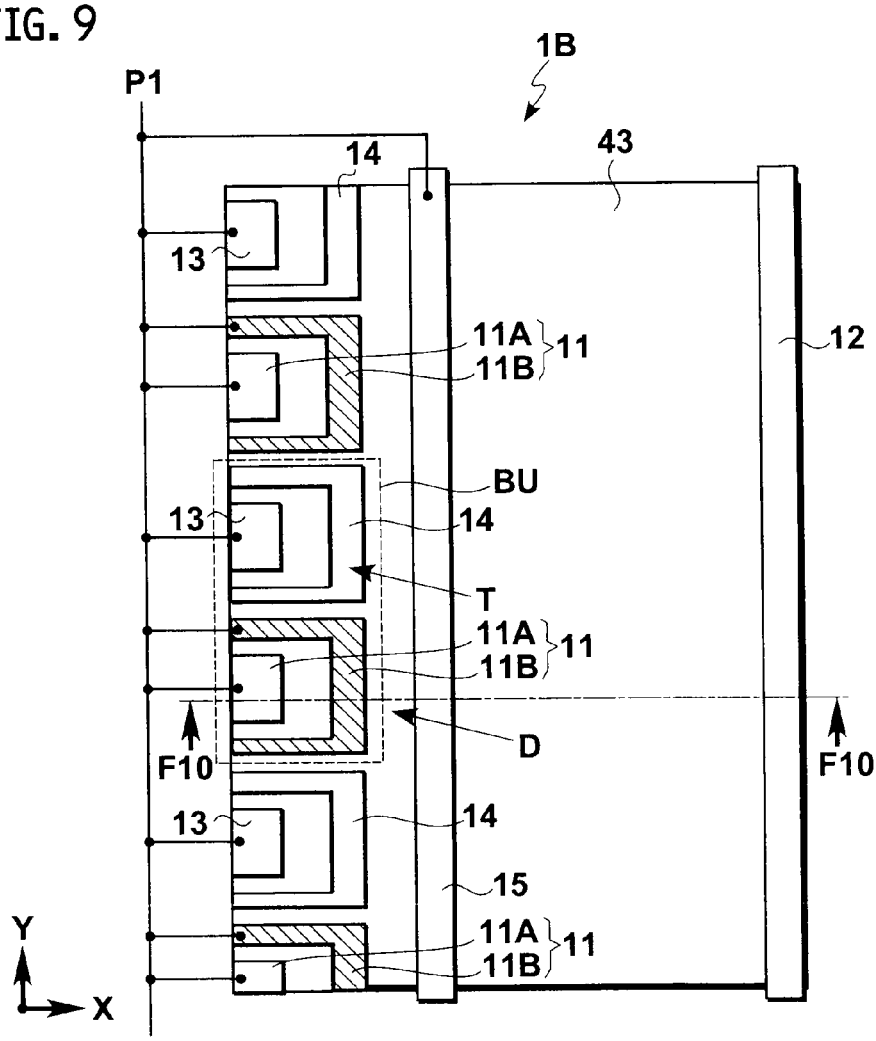
FIG. 9 is a plan view of main portions of a semiconductor device according to a third embodiment.
Figure 10:
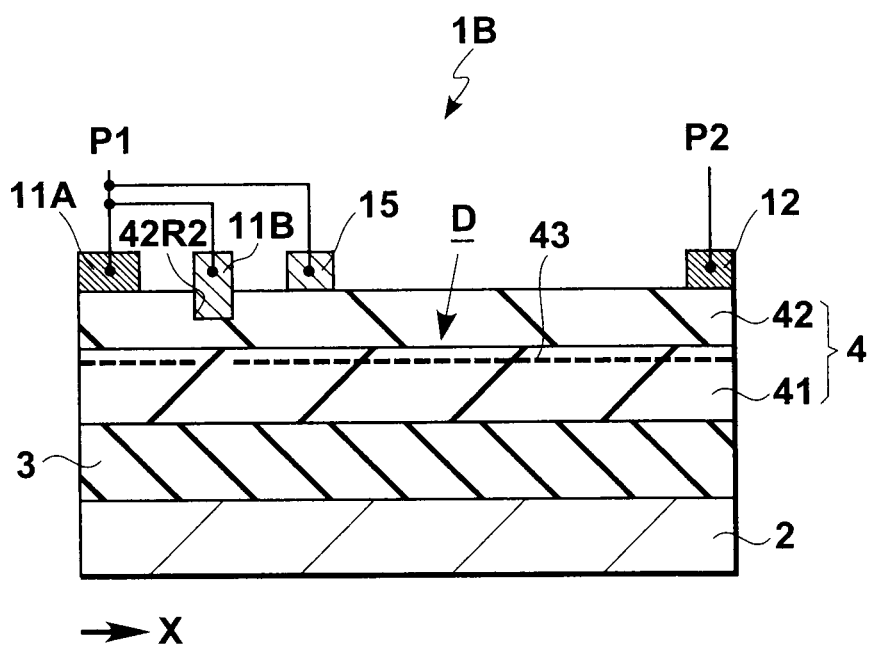
FIG. 10 is a schematic cross-sectional view of the rectifier of the semiconductor device cut along a line F10-F10 illustrated in FIG. 9.

As illustrated in FIGS. 9 and 10, in a semiconductor device 1B according to the third embodiment, a planar structure and cross-sectional structure of the transistor T are substantially the same as the planar structures and cross-sectional structures of the transistor T of the semiconductor devices 1 and 1A according to the above-mentioned first embodiment and second embodiment; however, the semiconductor device 1B is different from the semiconductor devices 1 and 1A particularly in planar structure and cross-sectional structure of the first main electrodes (anode electrode of the rectifier D) 11. Each of the first main electrodes 11 is composed of a composite electrode including a first sub-electrode 11A arranged on the one end of the current path 43, and a second sub-electrode 11B arranged so as to surround a periphery of the first sub-electrode 11A.

The first sub-electrode 11A of the first main electrode 11 is an ohmic electrode having low contact resistance (forward voltage) and using a field effect. For example, the first sub-electrode 11A is composed of the same structure and by using the same electrode material, which are the same as those of the third main electrodes (source electrode of the transistor T) 13. A planar shape of the first sub-electrode 11A is composed of the same shape as the planar shape of each of the third main electrodes 13 or a shape approximate thereto.

The second sub-electrode 11B is an electrode that controls a carrier concentration of the current path 43. For the second sub-electrode 11B, for example, a p-type semiconductor electrode material (n-type semiconductor electrode material in the case of the p-channel conduction-type HEMT) is used. Specifically, the second-sub electrode 11B is composed, for example, of a p-type semiconductor electrode material such as a semiconductor layer of AlGaN or the like doped with Mg and a metal oxide film of NiO or the like. A planar shape of the second sub-electrode 11B is composed in a similar way to the planar shape of the control electrode 14. In the third embodiment, the second sub-electrode 11B is arranged in a recess 42R2 arranged along the depth direction from the surface of the second semiconductor layer 42. Such a depth of the recess 42R2 is appropriately settable, or it is not necessary to provide the recess 42R2, either. The first sub-electrode 11A and the second sub-electrode 11B are electrically connected (short circuited) to each other, and are set at the same potential.

In the semiconductor device 1B according to the third embodiment, which is configured as described above, the reduction of the forward voltage can be further achieved in addition to the effects obtained by the semiconductor device 1 according to the first embodiment.

In the semiconductor device 1B according to the third embodiment, an electrode material forming the Schottky barrier may be used for the second sub-electrode 11B, and the second sub-electrode 11B and the control electrode 14 may be composed of the same structure and by using the same electrode material. Moreover, a planar shape of the second sub-electrode 11B can be composed in a similar way to the planar shape of the control electrode 14.

That is, the semiconductor device 1B according to the third embodiment is the one in which the structure of the third main electrode 13 and the control electrode 14 (that is, the structure of the source electrode and gate electrode of the transistor T) and the structure of the first main electrode 11 (that is, the structure of the anode electrode of the rectifier D) are made the same.

In the semiconductor device 1B according to the third embodiment, which is configured as described above, the electrode structure of the transistor T and the electrode structure of the rectifier D are made the same, whereby a device structure can be simplified. Moreover, in a manufacturing process of the semiconductor device 1B according to the third embodiment, the transistor T and the rectifier D are made into the same electrode structure, whereby the number of manufacturing steps of the electrodes can be reduced, and the number of entire manufacturing steps can be reduced.

Fourth Embodiment

A fourth embodiment of the present invention describes an application example of the semiconductor device 1 according to the above-mentioned first embodiment, which is also an example where a source common-type AC switch is constructed.

[Configuration of Switch Circuit Mounted on Semiconductor Device]

Figure 12:
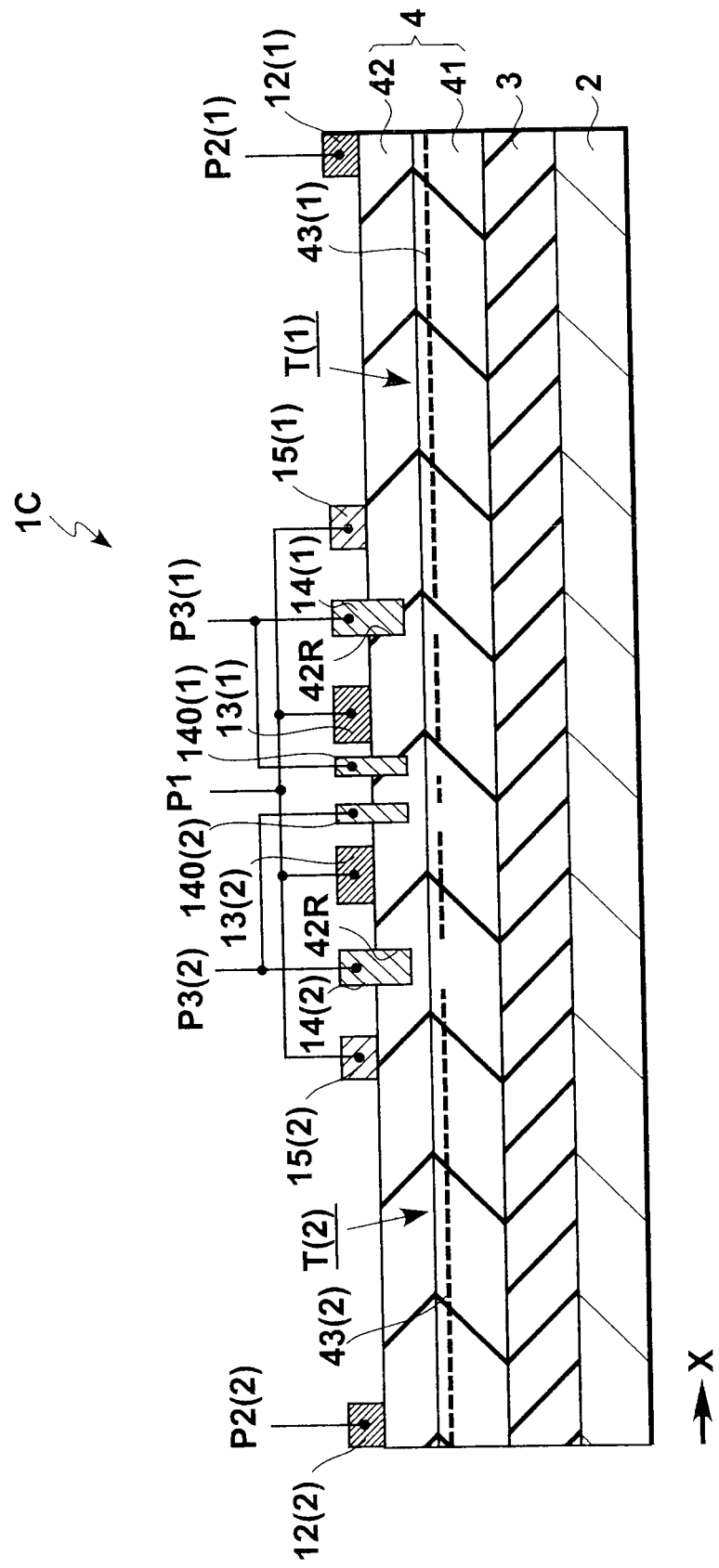
FIG. 12 is a schematic cross-sectional view of transistors of the semiconductor device cut along a line F12-F12 illustrated in FIG. 11.
Figure 13:
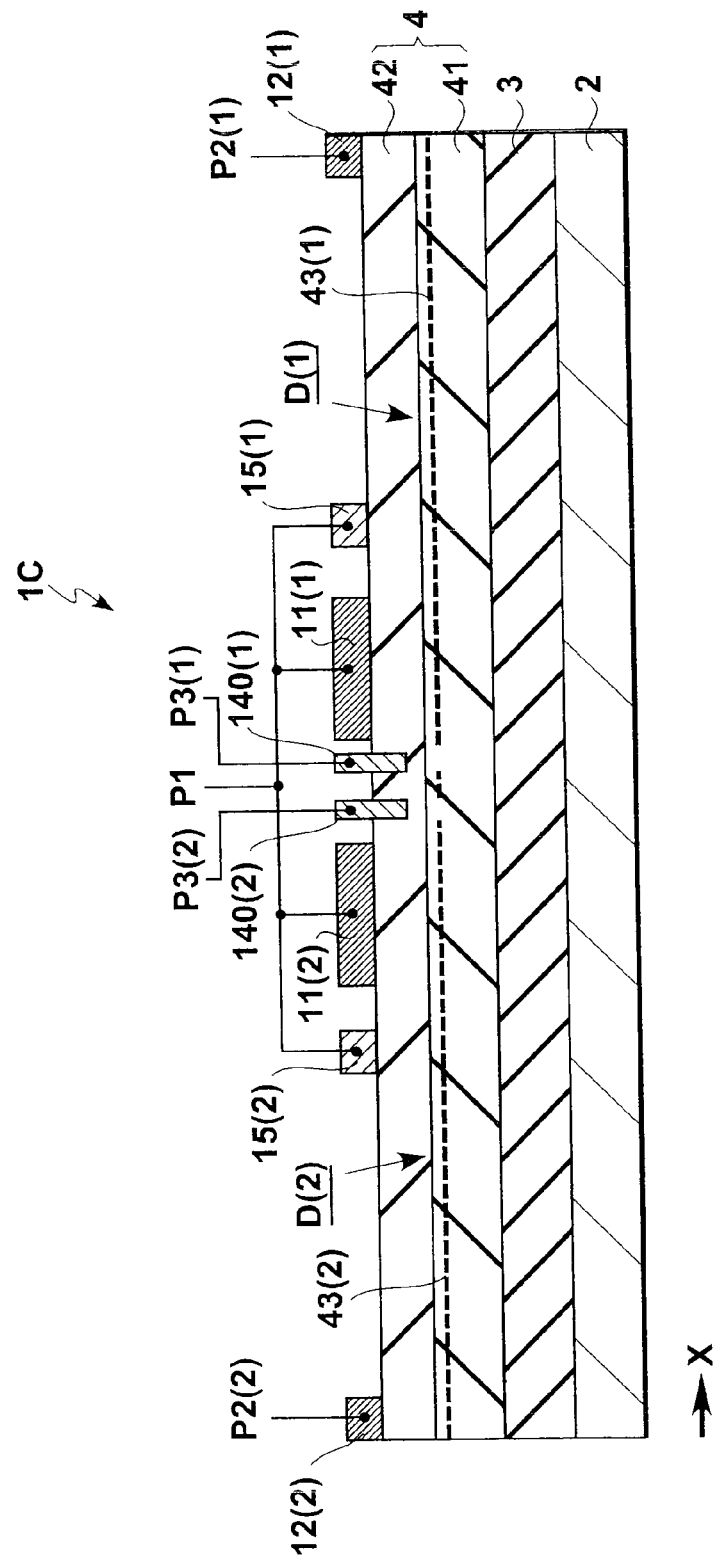
FIG. 13 is a schematic cross-sectional view of rectifiers of the semiconductor device cut along a line F13-F13 illustrated in FIG. 11.
Figure 14:
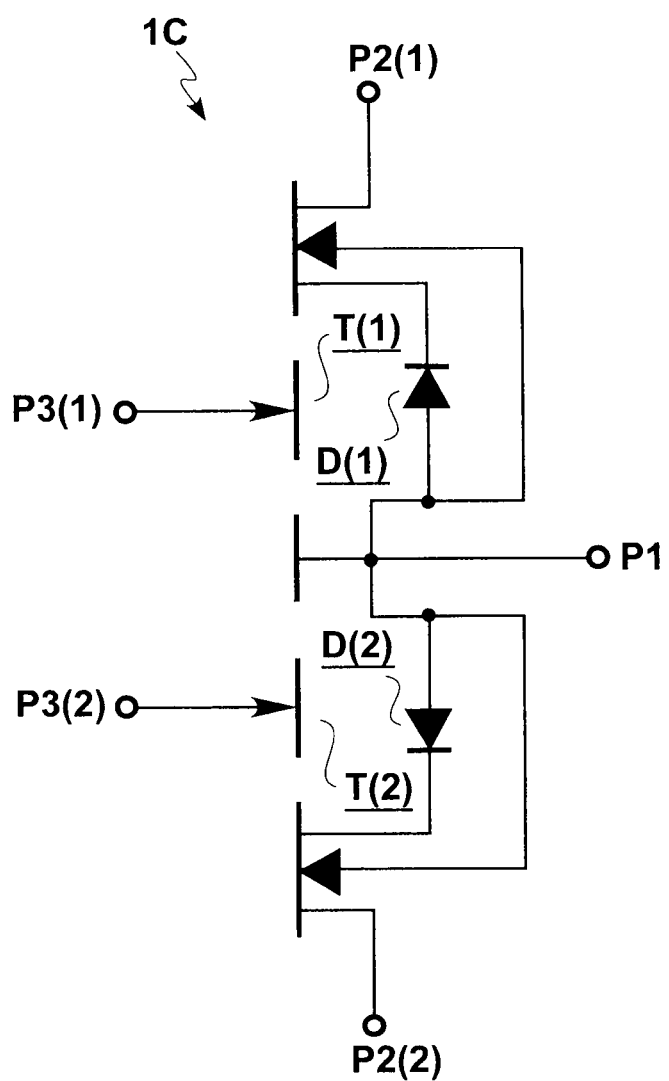
FIG. 14 is an equivalent circuit diagram of a source common-type AC switch mounted on the semiconductor device illustrated in FIG. 11.

On a semiconductor device 1C according to a fourth embodiment, which is illustrated in FIGS. 11 to 14, an AC switch in which source terminals are made common as illustrated in FIG. 14 (that is, a source common-type AC switch) is mounted. The source common-type AC switch includes: a transistor T(1) and a rectifier D(1), which are electrically connected in parallel to each other in such a manner that one end of each thereof is connected to a terminal P1, and the other end of each thereof is connected to a terminal P2(1); and a transistor T(2) and a rectifier D(2), which are electrically connected in parallel to each other in such a manner that one end of each thereof is connected to the terminal P1, and the other end of each thereof is connected to a terminal P2(2). The transistor T(1) has a terminal P3(1), and the transistor T(2) has a terminal P3(2).

Each of a circuit configuration of the transistor T(1) and the rectifier D(1) and a circuit configuration of the transistor T(2) and the rectifier D(2) is the same as a circuit configuration of the transistor T and rectifier D of the semiconductor device 1 according to the above-mentioned first embodiment, which is illustrated in FIG. 4.

[Device Configuration of Semiconductor Device]

Figure 11:
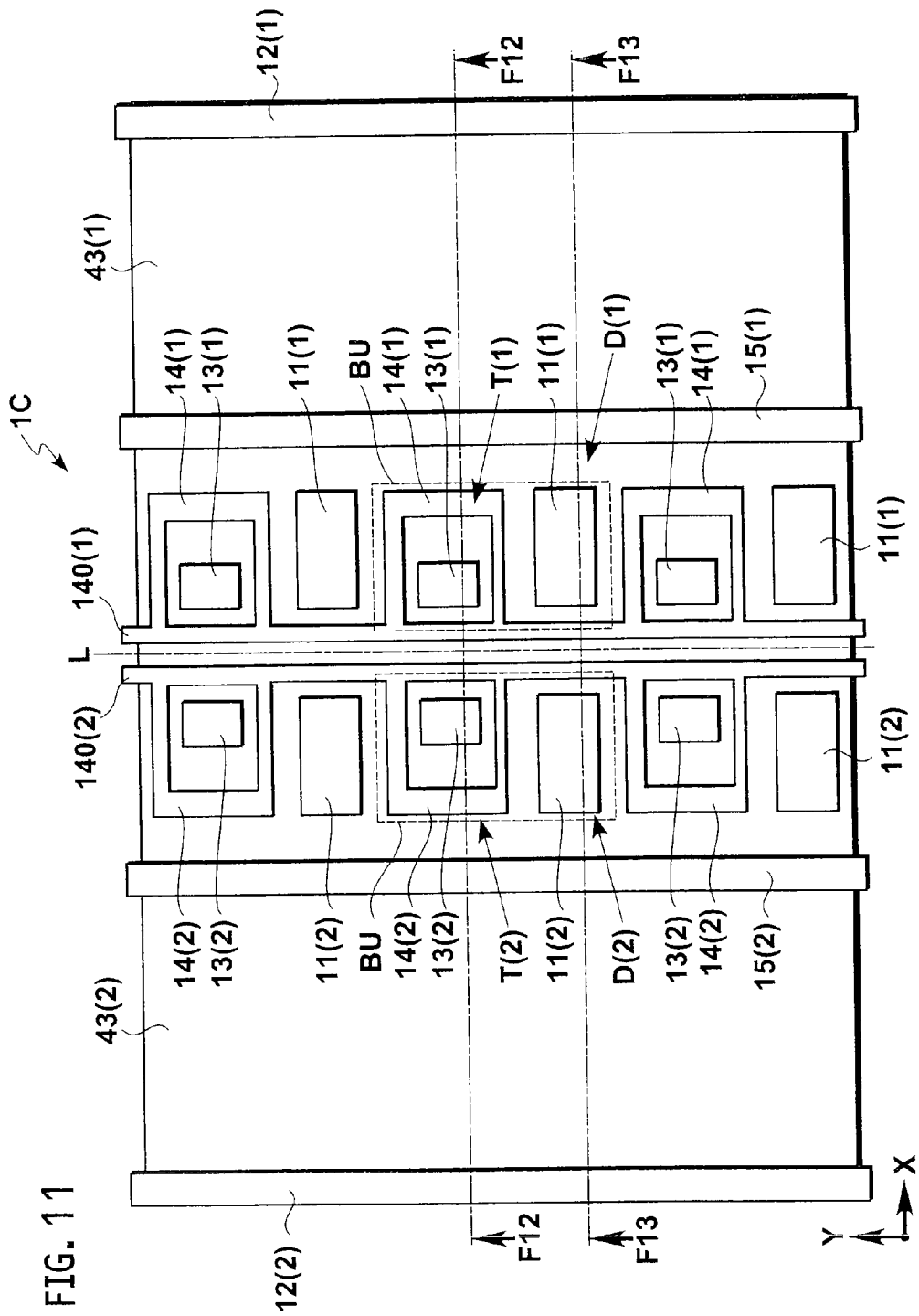
FIG. 11 is a plan view of main portions of a semiconductor device according to a fourth embodiment.

In the semiconductor device 1C according to the fourth embodiment, as illustrated in FIGS. 11 and 13, the rectifier D(1) arranged on an upper side of FIG. 14 includes a current path 43(1), first main electrodes 11(1), a second main electrode 12(1), and an auxiliary electrode 15(1). The first main electrodes 11(1) have the rectifying function, and are arranged on a center portion of the semiconductor device 1C, which corresponds to one end of the current path 43(1). The second main electrode 12(1) is arranged on the other end of the current path 43(1) (corresponding to a right side in FIGS. 11 and 13). The auxiliary electrode 15(1) has the rectifying function, and in addition, has a forward voltage larger in comparison with the first main electrodes 11(1), and is arranged in a region of the current path 43(1) between the first main electrodes 11(1) and the second main electrode 12(1). In the fourth embodiment, each of the first main electrodes 11(1) is an anode electrode of the rectifier D(1), and the second main electrode 12(1) is a cathode electrode of the rectifier D(1).

As illustrated in FIGS. 11 and 12, the transistor T(1) includes the current path 43(1), third main electrodes 13(1), control electrodes 14(1), the second main electrode 12(1), and the auxiliary electrode 15(1). On the center portion of the semiconductor device 1C, which corresponds to the one end of the current path 43(1), the third main electrodes 13(1) are arranged apart from the first main electrodes 11(1) in a direction intersecting the current path 43(1) (Y-direction). Each of the control electrodes 14(1) is arranged so as to enclose a periphery of each of the third main electrodes 13(1). Here, in the fourth embodiment, with regard to the transistor T(1) and the rectifier D(1), which are mounted on the semiconductor device 1C, the transistor T(1) is the n-channel conduction-type HEMT, and the rectifier D(1) is the SBD. Each of the third main electrodes 13(1) is a source electrode of the transistor T(1). The second main electrode 12(1) is a drain electrode of the transistor T(1), which is allowed to also serve as the cathode electrode of the rectifier D(1). Each of the control electrodes 14(1) is a gate electrode of the transistor T(1).

As illustrated in FIGS. 11 and 13, the rectifier D(2) arranged on a lower side of FIG. 14 include a current path 43(2), first main electrodes 11(2), a second main electrode 12(2), and an auxiliary electrode 15(2). The first main electrodes 11(2) have the rectifying function, and are arranged on the center portion of the semiconductor device 1C, which corresponds to the one end of the current path 43(2). The second main electrode 12(2) is arranged on the other end (corresponding to a left side in FIGS. 11 and 13) of the current path 43(2). The auxiliary electrode 15(2) has the rectifying function, and in addition, has a forward voltage larger in comparison with the first main electrodes 11(2), and is arranged in a region of the current path 43(2) between the first main electrode 11(2) and the second main electrode 12(2). Each of the first main electrodes 11(2) is an anode electrode of the rectifier D(2), and the second main electrode 12(2) is a cathode electrode of the rectifier D(2).

As illustrated in FIGS. 11 and 12, the transistor T(2) includes the current path 43(2), third main electrodes 13(2), control electrodes 14(2), the second main electrode 12(2), and the auxiliary electrode 15(2). On the center portion of the semiconductor device 1C, which corresponds to the one end of the current path 43(2), the third main electrodes 13(2) are arranged apart from the first main electrodes 11(2) in a direction intersecting the current path 43(2) (Y-direction). Each of the control electrodes 14(2) is arranged so as to enclose a periphery of each of the third main electrodes 13(2). Here, in the fourth embodiment, with regard to the transistor T(2) and the rectifier D(2), which are mounted on the semiconductor device 1C, the transistor T(2) is the n-channel conduction-type HEMT, and the rectifier D(2) is the SBD. Each of the third main electrodes 13(2) is a source electrode of the transistor T(2). The second main electrode 12(2) is a drain electrode of the transistor T(2), which is allowed to also serve as the cathode electrode of the rectifier D(2). Each of the control electrodes 14(2) is a gate electrode of the transistor T(2).

In the fourth embodiment, planar structures and cross-sectional structures of the transistor T(1) and the rectifier D(1) are substantially the same as the planar structures and cross-sectional structures of the transistor T and the rectifier D of the semiconductor device 1 according to the above-mentioned first embodiment. Planar structures and cross-sectional structures of the transistor T(2) and the rectifier D(2) are the same as the planar structures and cross-sectional structures of the transistor T(1) and the rectifier D(1); however, are composed of shapes obtained by inverting these planar structures and cross-sectional structures by 180 degrees. That is to say, the transistor T(1) and the rectifier D(1) and the transistor T(2) and the rectifier D(2) are linearly arrayed in the X-direction, and are composed of axial-symmetric shapes with respect to, as a center, a virtual centerline L extended in the Y-direction on the center portion of the semiconductor device 1C illustrated in FIG. 11. The virtual centerline L is an imaginary centerline written in FIG. 11 for the purpose of convenience in order to facilitate the understanding.

Moreover, the control electrodes 14(1) of the respective base units BU arrayed in the Y-direction are electrically connected to one another through a control electrode wire 140(1). The control electrode wire 140(1) has functions to supply a potential from the terminal P3(1) to the respective control electrodes 14(1), and to electrically isolate a region of the transistor T(1) and the rectifier D(1) and a region of the transistor T(2) and the rectifier D(2) from each other.

Meanwhile, the control electrodes 14(2) of the respective base units BU arrayed in the Y-direction are electrically connected to one another through a control electrode wire 140(2). The control electrode wire 140(2) has functions to supply a potential from the terminal P3(2) to the respective control electrodes 14(2), and to electrically isolate the region of the transistor T(1) and the rectifier D(1) and the region of the transistor T(2) and the rectifier D(2) from each other.

In the semiconductor device 1C according to the fourth embodiment, which is configured as described above, the source common-type AC switch can be further constructed in addition to the effects obtained by the semiconductor device 1 according to the first embodiment.

Fifth Embodiment

A fifth embodiment of the present invention describes an application example of the semiconductor device 1 according to the first embodiment, which is also an example where a one gate-type AC switch is constructed.
[Configuration of Switch Circuit Mounted on Semiconductor Device]

Figure 15:
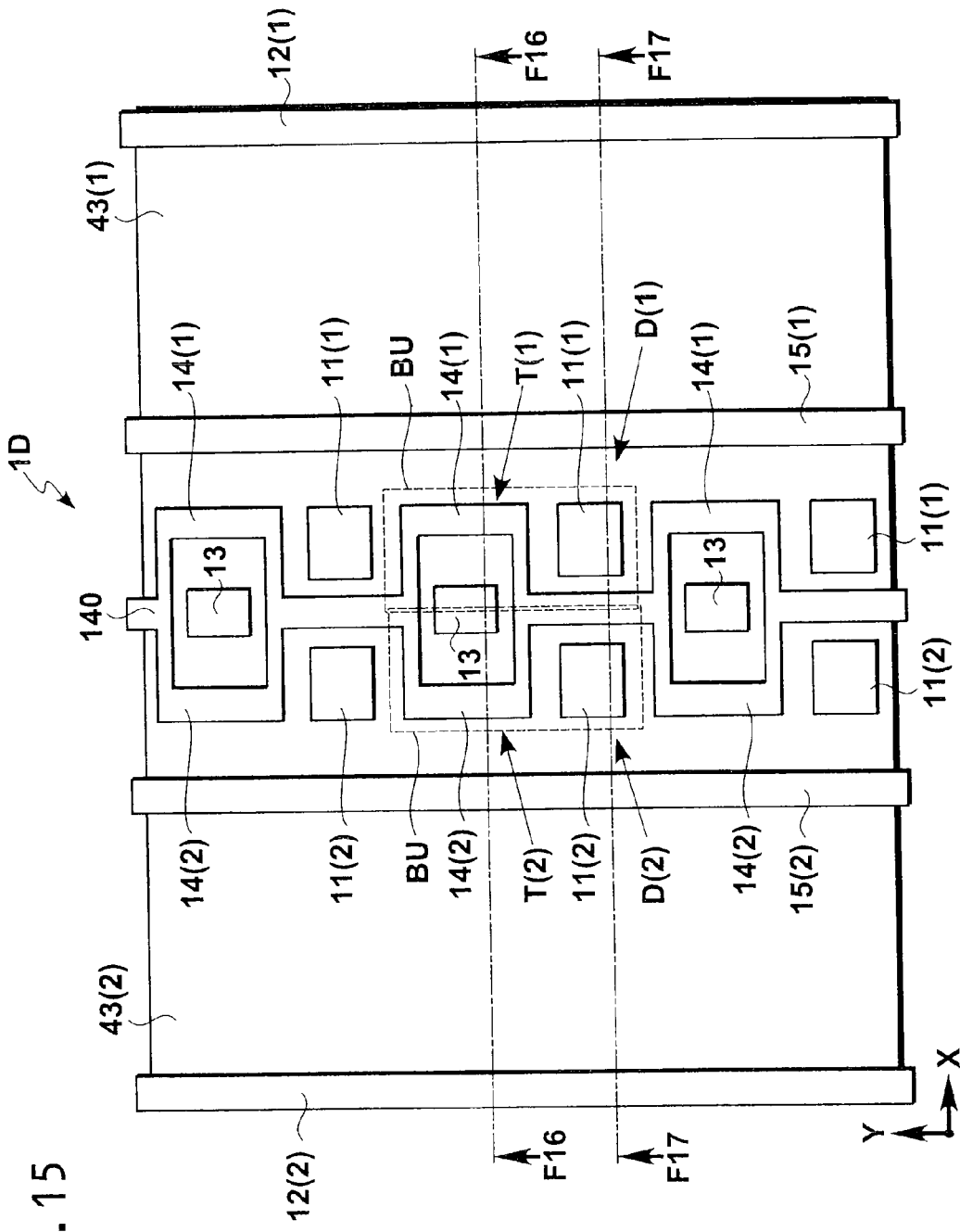
FIG. 15 is a plan view of main portions of a semiconductor device according to a fifth embodiment.
Figure 16:
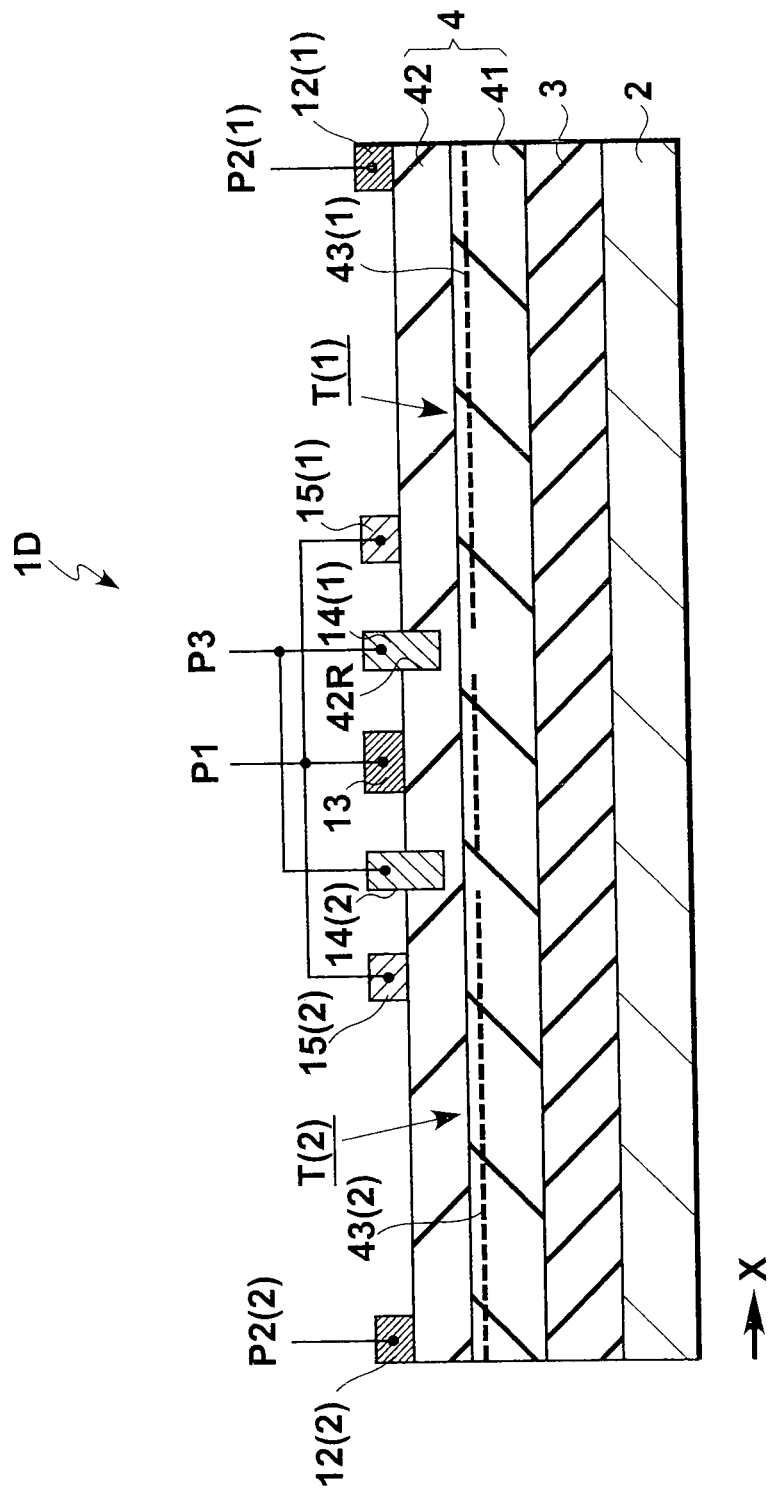
FIG. 16 is a schematic cross-sectional view of transistors of the semiconductor device cut along a line F16-F16 illustrated in FIG. 15.
Figure 17:
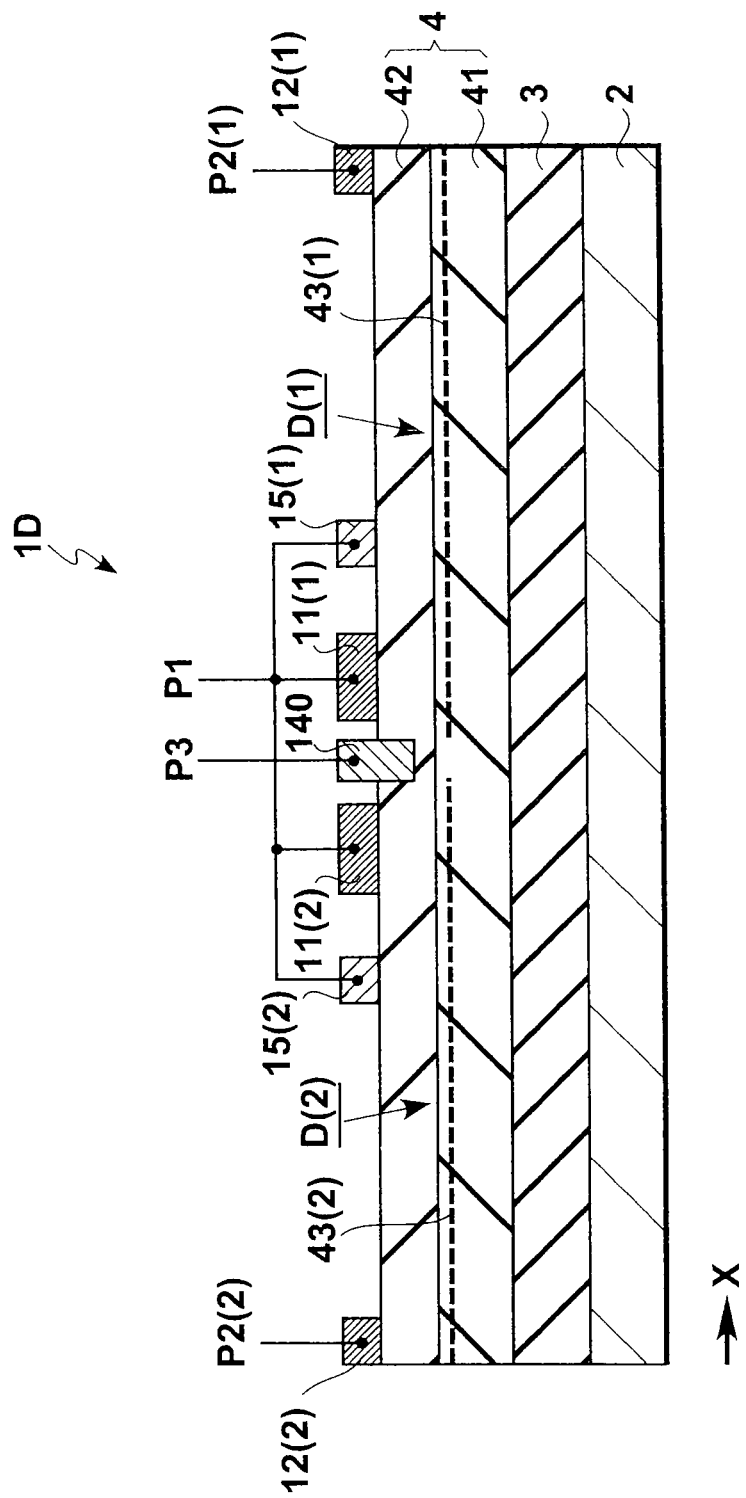
FIG. 17 is a schematic cross-sectional view of rectifiers of the semiconductor device cut along a line F17-F17 illustrated in FIG. 15.

On a semiconductor device 1D according to the fifth embodiment, which is illustrated in FIGS. 15 to 17, an AC switch (one gate-type AC switch) in which gate terminals P3(1) and P3(2) are made common is mounted in an equivalent circuit diagram illustrated in FIG. 14. In the one gate-type AC switch, terminal P3 is electrically connected individually to the transistor T(1) and the transistor T(2), and the terminal P3 is shared by the transistor T(1) and the transistor T(2). In other points, the one gate-type AC switch is configured in substantially the same way as the semiconductor device 1C according to the fourth embodiment.

Each of a circuit configuration of the transistor T(1) and the rectifier D(1) and a circuit configuration of the transistor T(2) and the rectifier D(2) is the same as the circuit configuration of the transistor T and the rectifier D in the semiconductor device 1 according to the above-mentioned first embodiment, which is illustrated in FIG. 4.
[Device Configuration of Semiconductor Device]

In the semiconductor device 1D according to the fifth embodiment, as illustrated in FIGS. 15 and 17, the rectifier D(1) arranged on an upper side of FIG. 14 is configured in substantially the same way as the rectifier D(1) in the semiconductor device 1C according to the fourth embodiment.

As illustrated in FIGS. 15 and 16, the transistor T(1) includes a current path 43(1), third main electrodes 13, control electrodes 14(1), a second main electrode 12(1), and an auxiliary electrode 15(1). On a center portion of the semiconductor device 1D, which corresponds to one end of the current path 43(1), the third main electrodes 13 are arranged apart from the first main electrodes 11(1) in a direction intersecting the current path 43(1) (Y-direction). Each of the control electrodes 14(1) is arranged so as to enclose a periphery of each of the third main electrodes 13. Here, in the fifth embodiment, with regard to the transistor T(1) and the rectifier D(1), which are mounted on the semiconductor device 1D, the transistor T(1) is the n-channel conduction-type HEMT, and the rectifier D(1) is the SBD. Moreover, each of the third main electrodes 13 is a source electrode of the transistor T(1), the second main electrode 12(1) is a drain electrode of the transistor T(1), which is allowed to also serve as a cathode electrode of the rectifier D(1), and each of the control electrodes 14(1) is a gate electrode of the transistor T(1).

In the semiconductor device 1D according to the fifth embodiment, as illustrated in FIGS. 15 and 17, the rectifier D(2) arranged on a lower side of FIG. 14 is configured in substantially the same way as the rectifier D(2) in the semiconductor device 1C according to the fourth embodiment.

As illustrated in FIGS. 15 and 16, the transistor T(2) includes a current path 43(2), third main electrodes 13, control electrodes 14(2), a second main electrode 12(2), and an auxiliary electrode 15(2). On the center portion of the semiconductor device 1D, which corresponds to one end of the current path 43(2), the third main electrodes 13 are arranged apart from the first main electrodes 11(2) in a direction intersecting the current path 43(2) (Y-direction), and are allowed to also serve as the third main electrodes 13 of the transistor T(1). Each of the control electrodes 14(2) is arranged so as to enclose a periphery of each of the third main electrodes 13. Here, in the fifth embodiment, with regard to the transistor T(2) and the rectifier D(2), which are mounted on the semiconductor device 1D, the transistor T(2) is the n-channel conduction-type HEMT, and the rectifier D(2) is the SBD. Each of the third main electrodes 13 is a source electrode of the transistor T(2). The second main electrode 12(2) is a drain electrode of the transistor T(2), which is allowed to also serve as a cathode electrode of the rectifier D(2). Each of the control electrodes 14(2) is a gate electrode of the transistor T(2).

Planar structures and cross-sectional structures of the transistor T(1), the transistor T(2), the rectifier D(1), and the rectifier D(2) in the semiconductor device 1D according to the fifth embodiment resemble the planar structures and cross-sectional structures of the transistor T(1), the transistor T(2), the rectifier D(1), and the rectifier D(2) in the semiconductor device 1C according to the above-mentioned fourth embodiment. However, the transistor T(1) and transistor T(2) in the semiconductor device 1D according to the fifth embodiment individually allow (share) the third main electrodes 13 to also serve as the source electrodes of the transistor T(1) and transistor T(2).

Moreover, in the semiconductor device 1D according to the fifth embodiment, the control electrodes 14(1) in base units BU of the transistor T(1) and the control electrodes 14(2) in the base units BU of the transistor T(2) are composed integrally with each other (that is, electrically connected to each other). The control electrodes 14(1) and 14(2) in the respective base units BU arrayed in the Y-direction construct one control electrode wire 140 extended in the Y-direction. The control electrode wire 140 has functions to supply a potential from the terminal P3 to the respective control electrodes 14(1) and 14(2), and to electrically isolate a region of the transistor T(1) and the rectifier D(1) and a region of the transistor T(2) and the rectifier D(2) from each other.

In the semiconductor device 1D according to the fifth embodiment, which is configured as described above, the one gate-type AC switch can be constructed in addition to the effects obtained by the semiconductor device 1 according to the first embodiment. Moreover, in the one gate-type AC switch, the third main electrodes 13 shared by the transistor T(1) and transistor T(2) are provided, and the control electrode wire 140 that connects the control electrodes 14(1) and 14(2) to each other is provided. Therefore, the one gate-type AC switch constructed of the semiconductor device 1D according to the fifth embodiment can enhance the area utilization efficiency in comparison with the source common-type AC switch constructed of the semiconductor device 1C according to the fourth embodiment.

Sixth Embodiment

A sixth embodiment of the present invention describes an application example of the semiconductor device 1 according to the first embodiment, which is also an example where a drain common-type AC switch is constructed.
[Configuration of Switch Circuit Mounted on Semiconductor Device]

Figure 19:
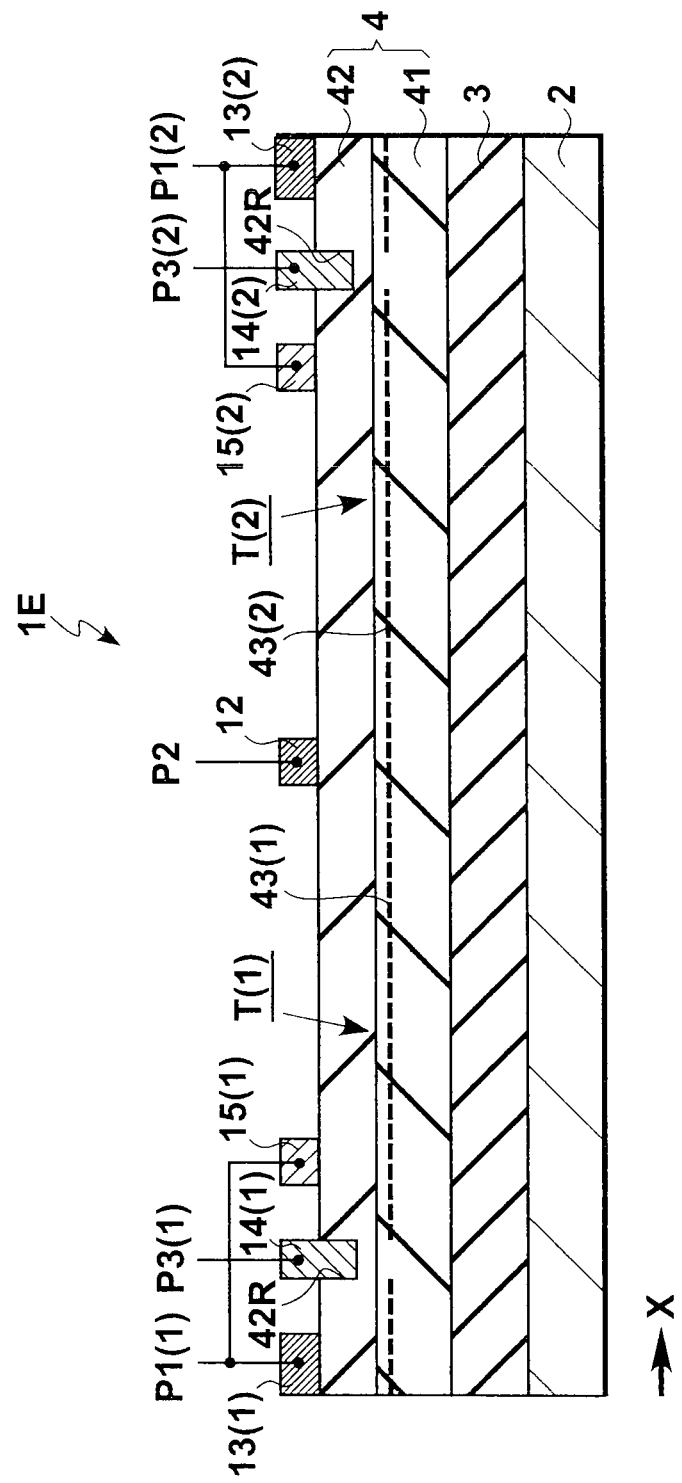
FIG. 19 is a schematic cross-sectional view of transistors of the semiconductor device cut along a line F19-F19 illustrated in FIG. 18.
Figure 20:
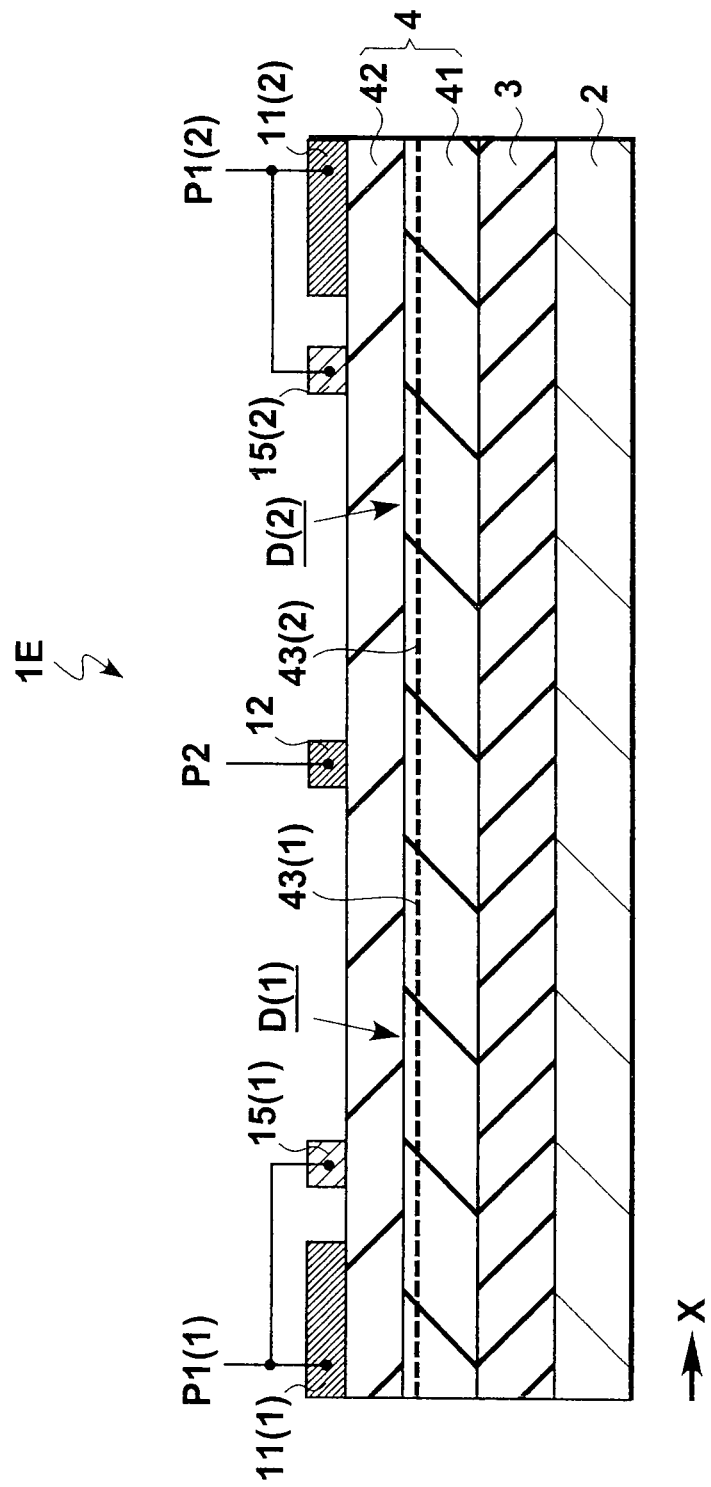
FIG. 20 is a schematic cross-sectional view of rectifiers of the semiconductor device cut along a line F20-F20 illustrated in FIG. 18.
Figure 21:
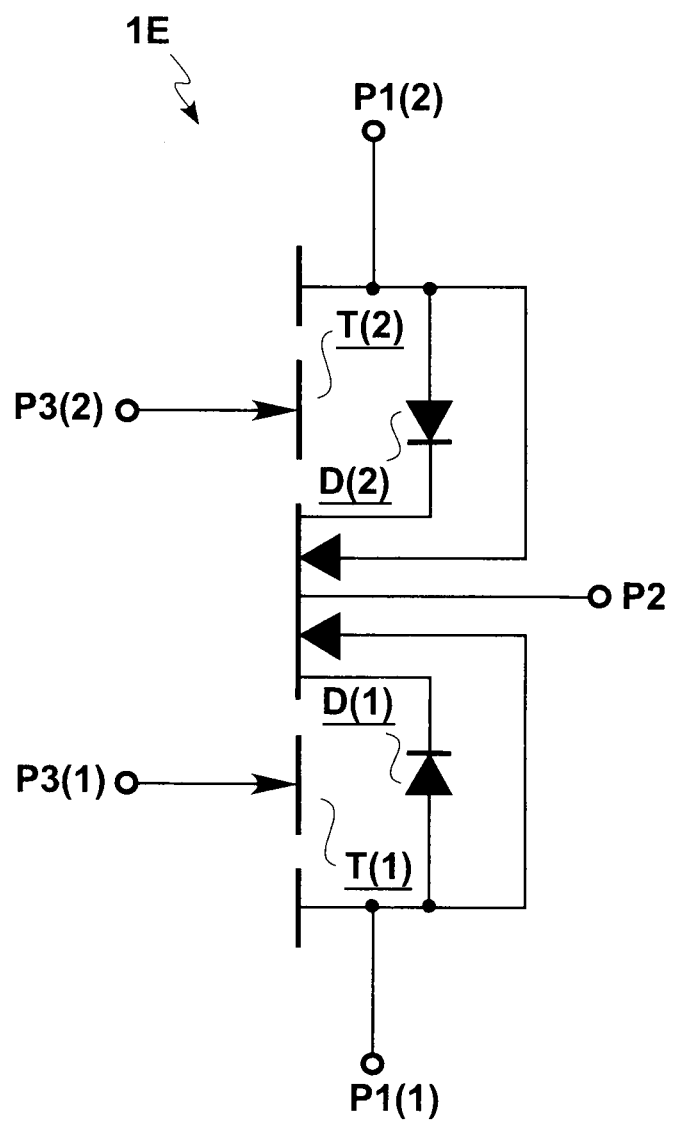
FIG. 21 is an equivalent circuit diagram of a drain common-type AC switch mounted on the semiconductor device illustrated in FIG. 18.

On a semiconductor device 1E according to the sixth embodiment, which is illustrated in FIGS. 18 to 21, an AC switch illustrated in FIG. 21, in which drain terminals are made common (drain common-type AC switch), is mounted. The drain common-type AC switch includes: a transistor T(1) and a rectifier D(1), which are electrically connected in parallel to each other, and each of which has one end connected to a terminal P1(1) and the other end connected to a terminal P2; and a transistor T(2) and a rectifier D(2), which are electrically connected in parallel to each other, and each of which has one end connected to a terminal P1(2) and the other end connected to the shared terminal P2. A terminal P3(1) is electrically connected to a gate of the transistor T(1). A terminal P3(2) is electrically connected to a gate of the transistor T(2).

Each of a circuit configuration of the transistor T(1) and the rectifier D(1) and a circuit configuration of the transistor T(2) and the rectifier D(2) is the same as the circuit configuration of the transistor T and rectifier D of the semiconductor device 1 according to the above-mentioned first embodiment, which is illustrated in FIG. 4.
[Device Configuration of Semiconductor Device]

Figure 18:
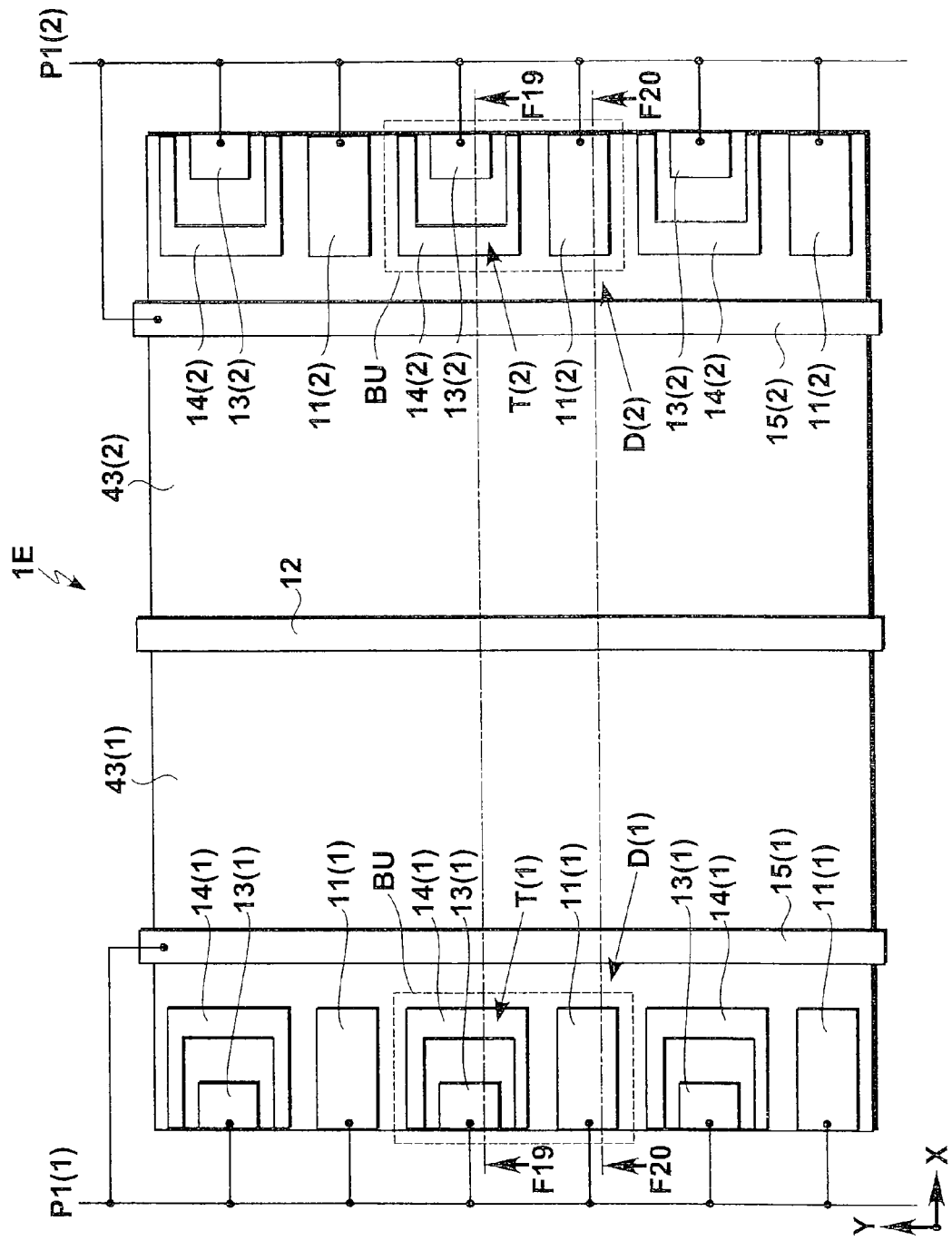
FIG. 18 is a plan view of main portions of a semiconductor device according to a sixth embodiment.

In the semiconductor device 1E according to the sixth embodiment, as illustrated in FIGS. 18 and 20, the rectifier D(1) arranged on a lower side of FIG. 21 includes a current path 43(1), first main electrodes 11(1), a second main electrode 12, and an auxiliary electrode 15(1). The first main electrodes 11(1) have the rectifying function, and are arranged on one end of the current path 43(1) (left side in FIGS. 18 and 20). The second main electrode 12 is arranged on a center portion of the semiconductor device 1E, which corresponds to the other end of the current path 43(1). The auxiliary electrode 15(1) has the rectifying function, and in addition, has a forward voltage larger in comparison with the first main electrodes 11(1), and is arranged in a region of the current path 43(1) between the first main electrodes 11(1) and the second main electrode 12. Each of the first main electrodes 11(1) is an anode electrode of the rectifier D(1). The second main electrode 12 is a cathode electrode of the rectifier D(1).

As illustrated in FIGS. 18 and 19, the transistor T(1) includes the current path 43(1), third main electrodes 13(1), control electrodes 14(1), and the second main electrode 12. On one end of the current path 43(1) (left side in FIGS. 18 and 19), the third main electrodes 13(1) are arranged apart from the first main electrodes 11(1) in a direction intersecting the current path 43(1) (Y-direction). Each of the control electrodes 14(1) is arranged so as to enclose a periphery of each of the third main electrodes 13(1). Here, in the sixth embodiment, with regard to the transistor T(1) and the rectifier D(1), which are mounted on the semiconductor device 1E, the transistor T(1) is the n-channel conduction-type HEMT, and the rectifier D(1) is the SBD. Each of the third main electrodes 13(1) is a source electrode of the transistor T(1). The second main electrode 12 is a drain electrode of the transistor T(1), which is allowed to also serve as the cathode electrode of the rectifier D(1). Each of the control electrodes 14(1) is a gate electrode of the transistor T(1).

As illustrated in FIGS. 18 and 20, the rectifier D(2) arranged on an upper side of FIG. 21 includes a current path 43(2), first main electrodes 11(2), the second main electrode 12, and auxiliary electrodes 15(2). The first main electrodes 11(2) have the rectifying function, and are arranged on one end of the current path 43(2) (right side in FIGS. 18 and 20). The second main electrode 12 is arranged on the center portion of the semiconductor device 1E, which corresponds to the other end of the current path 43(2). The auxiliary electrode 15(2) has the rectifying function, and in addition, has a forward voltage larger in comparison with the first main electrodes 11(2), and is arranged in a region of the current path 43(2) between the first main electrodes 11(2) and the second main electrode 12. Each of the first main electrodes 11(2) is an anode electrode of the rectifier D(2). The second main electrode 12 is a cathode electrode of the rectifier D(2), and is shared as the cathode electrode of the rectifier D(1) and the drain electrodes of the transistor T(1) and transistor T(2).

As illustrated in FIGS. 18 and 19, the transistor T(2) includes the current path 43(2), third main electrodes 13(2), control electrodes 14(2), and the second main electrode 12. On one end of the current path 43(2) (right side in FIGS. 18 and 19), the third main electrodes 13(2) are arranged apart from the first main electrodes 11(2) in a direction intersecting the current path 43(2) (Y-direction). Each of the control electrodes 14(2) is arranged so as to enclose a periphery of each of the third main electrodes 13(2). The second main electrode 12 is shared as the second main electrode 12 of the transistor T(1). Here, in the sixth embodiment, with regard to the transistor T(2) and the rectifier D(2), which are mounted on the semiconductor device 1E, the transistor T(2) is the n-channel conduction-type HEMT, and the rectifier D(2) is the SBD. Each of the third main electrodes 13(2) is a source electrode of the transistor T(2). The second main electrode 12 is a drain electrode of the transistor T(2). Each of the control electrodes 14(2) is a gate electrode of the transistor T(2).

Planar structures and cross-sectional structures of the transistor T(1), the transistor T(2), the rectifier D(1), and the rectifier D(2) in the semiconductor device 1E according to the sixth embodiment resemble the planar structures and cross-sectional structures of the transistor T(1), the transistor T(2), the rectifier D(1), and the rectifier D(2) in the semiconductor device 1C according to the fourth embodiment. However, in the semiconductor device 1E according to the sixth embodiment, the respective drain electrodes of the transistor T(1) and transistor T(2) and the respective cathode electrodes of the respective rectifier D(1) and rectifier D(2) are composed of the second main electrode 12. The second main electrode 12 is extended in the Y-direction.

In the semiconductor device 1E according to the sixth embodiment, which is configured as described above, the drain common-type AC switch can be further constructed in addition to the effects obtained by the semiconductor device 1 according to the first embodiment. In the drain common-type AC switch, the second main electrode 12 shared by the transistor T(1) and transistor T(2) is provided, and the second main electrode 12 is also shared by the rectifier D(1) and rectifier D(2). Therefore, the drain common-type AC switch constructed of the semiconductor device 1E according to the sixth embodiment can enhance the area utilization efficiency in comparison with the source common-type AC switch constructed of the semiconductor device 1C according to the fourth embodiment.

Modification Example

On a modification example of the semiconductor device 1E according to the sixth embodiment, an AC switch controlled by two different gate terminals excluding the terminal P2 from the circuit diagram illustrated in FIG. 21 (two gate-type AC switch) is mounted. The two gate-type AC switch includes: the transistor T(1) and the rectifier D(1), which are electrically connected in parallel to each other, and have one ends connected to the terminal P1(1) and the other ends individually connected to the drain region side of the transistor T(2) and the cathode region side of the rectifier D(2); and the transistor T(2) and the rectifier D(2), which are electrically connected in parallel to each other, and have one ends connected to the terminal P1(2) and the other ends individually connected to the drain region side of the transistor T(1) and the cathode region side of the rectifier D(1). That is to say, the second main electrode 12, which is illustrated in FIGS. 18 to 20 and is common to the respective transistor T(1), transistor T(2), rectifier D(1), and rectifier D(2), is not present, drain regions of both of the transistor T(1) and transistor T(2) are electrically connected to each other, and cathode regions of both of the rectifier D(1) and rectifier D(2) are electrically connected to each other. The terminal P3(1) is electrically connected to the gate of the transistor T(1). The terminal P3(2) is electrically connected to the gate of the transistor T(2).

As mentioned above, even in the modification example of the semiconductor device 1E according to the sixth embodiment, each of a circuit configuration of the transistor T(1) and the rectifier D(1) and a circuit configuration of the transistor T(2) and the rectifier D(2) is the same as the circuit configuration of the transistor T and the rectifier D in the semiconductor device 1 according to the above-mentioned first embodiment, which is illustrated in FIG. 4.

Moreover, as in the modification example of the semiconductor device 1E according to the sixth embodiment, without providing the second main electrode 12, the respective drain regions 43 of the transistor T(1) and transistor T(2) may be electrically connected to each other, and the respective cathode regions 43 of the rectifier D(1) and rectifier D(2) may be electrically connected to each other.

In the two gate-type AC switch, the drain region 43 shared by the transistor T(1) and transistor T(2) and the cathode region 43 shared by the rectifier D(1) and rectifier D(2) are allowed to also serve each other. Therefore, the two gate-type AC switch constructed in accordance with the modification example of the semiconductor device 1E according to the sixth embodiment can enhance the area utilization efficiency in comparison with the drain common-type AC switch constructed of the semiconductor device 1E according to the sixth embodiment.

Seventh Embodiment

A seventh embodiment of the present invention describes an application example of the semiconductor device 1 according to the above-mentioned first embodiment, which is also an example where a field plate structure is adopted.

[Device Configuration of Semiconductor Device]

Figure 22:
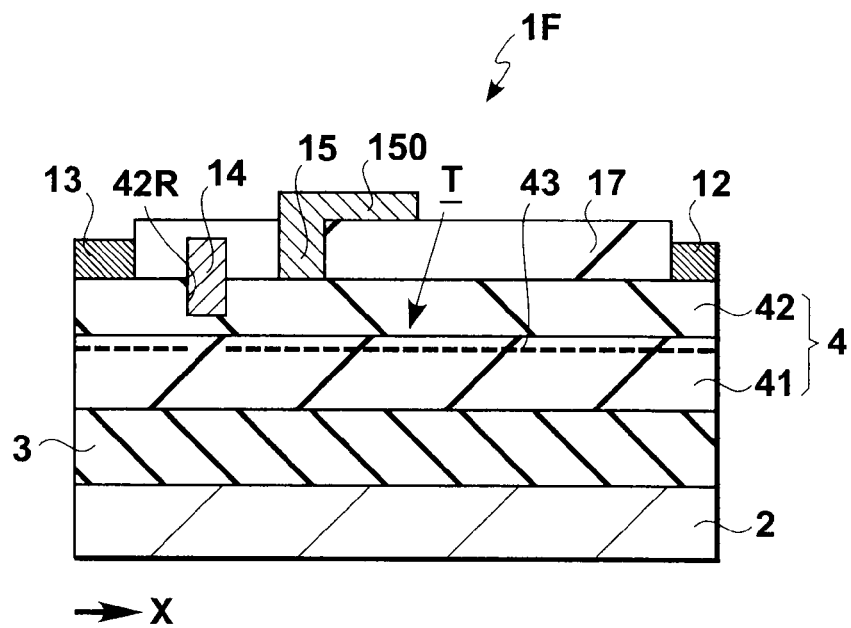
FIG. 22 is a cross-sectional view of main portions of a semiconductor device according to a seventh embodiment.

As illustrated in FIG. 22, a semiconductor device 1F according to the seventh embodiment includes a field plate (FP) 150, which is electrically connected to the auxiliary electrode 15, on the current path 43 at least between the auxiliary electrode 15 and second main electrode (drain electrode) 12 of the transistor T. On the second semiconductor layer 42 of the semiconductor function layer 4, a passivation film 17 is arranged. The filed plate 150 is drawn out onto the passivation film 17. In the semiconductor device 1F according to the seventh embodiment, the field plate 150 is composed of the same electrode material as that of the auxiliary electrode 15, and is composed integrally with the auxiliary electrode 15. In the manufacturing process, the field plate 150 is formed by using the same manufacturing steps as the steps for forming the auxiliary electrode 15.

In the semiconductor device 1F according to the seventh embodiment, which is configured as described above, the filed plate structure can be further constructed in addition to the effects obtained by the semiconductor device 1 according to the first embodiment. By adopting the field plate structure, the withstand voltage of the transistor T can be further enhanced, and a current collapse phenomenon can be reduced.

Modification Example

Figure 23:
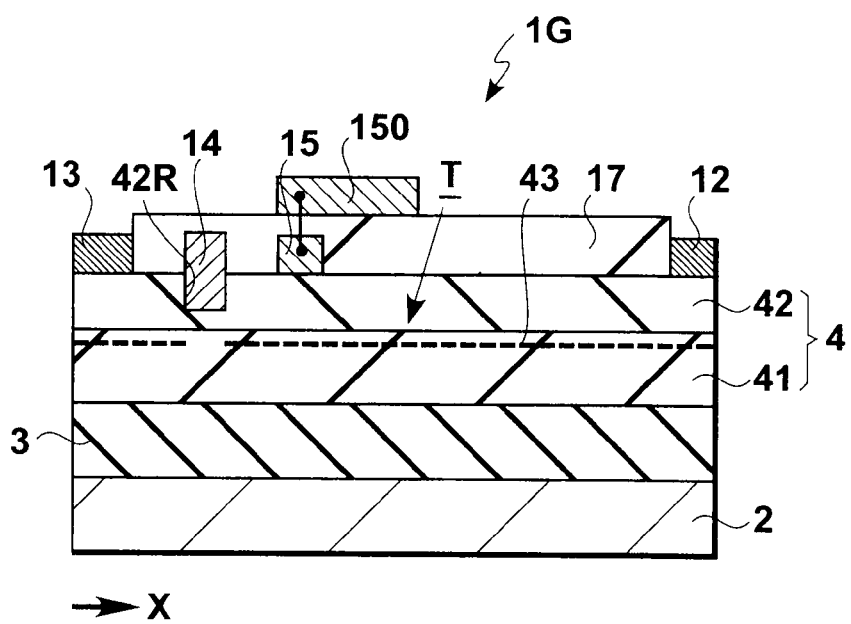
FIG. 23 is a cross-sectional view of main portions of a semiconductor device according to a modification example of the seventh embodiment.

As illustrated in FIG. 23, a semiconductor device 1G according to a modification example of the seventh embodiment may separate the electrode material of the field plate 150 from the electrode material of the auxiliary electrode 15. In other words, in the manufacturing process, the step of forming the auxiliary electrode 15 and the step of forming the field plate 150 can be separated from each other.

Electric connection between the control electrode 14 and the field plate 150 is not shown; however, it is sufficient if, after the auxiliary electrode 15 is formed, the field plate 150 connected to the auxiliary electrode 15 is formed thereon. Moreover, after the auxiliary electrode 15 and the field plate 150 are formed, a wire may be formed thereon, and the electric connection between both thereof may be performed by using the wire.

As described above, in each of the semiconductor devices 1 to 1G according to the embodiments of the present invention, while enhancing the area utilization efficiency, the characteristics of the transistor T can be enhanced, and further, the reduction of the forward voltage of the rectifier D can be achieved.

Other Embodiments

As described above, the present invention is described by a plurality of the embodiments; however, the description and the drawings, which form a part of the disclosure, do not limit the invention. The present invention can be applied to varieties of alternative embodiments, examples and application technologies.

For example, in the present invention, for the control electrode 14, an insulating electrode material (electrode material having a metal-insulator-semiconductor (MIS) structure) and the like can be used without being limited only to the Schottky electrode material and the p-type semiconductor electrode material. In the case of using such an electrode material, the transistor T may have either one of normally-on-type characteristics and normally-off-type characteristics.

Moreover, the recess on which the control electrode 14 is arranged and the recess on which the auxiliary electrode 15 is arranged may be formed of the same structure.

Moreover, for the semiconductor function layer 4, the AlGaN/GaN structure having the simple heterojunction is used; however, the present invention is not limited to this structure. For example, in the present invention, a GaN/AlGaN/AlN/GaN structure to which a cap layer and a spacer layer are added may be used as the semiconductor function layer 4.

Moreover, the present invention is not limited to the transistor T using the two-dimensional electron gas channel as the current path 43, and can also be applied, for example, a MESFET using an n-type GaN layer as the current path, and a MOSFET using an inversion channel layer as the current path.

Then, the present invention may be a semiconductor device in which at least two or more of the above-mentioned first to seventh embodiments are combined together. For example, the source common-type AC switch as the semiconductor device 1D according to the fifth embodiment and the drain common-type AC switch as the semiconductor device 1E according to the sixth embodiment may be mounted on the same substrate 2, and may be hybridized.

What is claimed is:

1. A semiconductor device having a transistor and a rectifier, comprising:
    a current path;
    a first main electrode having a rectifying function and arranged on one end of the current path;
    a second main electrode arranged on the other end of the current path;
    an auxiliary electrode arranged in a region of the current path between the first main electrode and the second main electrode;
    a third main electrode arranged on the one end of the current path apart from the first main electrode along a direction intersecting the current path; and
    a control electrode arranged in a region of the current path between the second main electrode and the third main electrode, wherein
    the transistor includes the current path, the second main electrode, the third main electrode, and the control electrode, and
    the rectifier includes the current path, the first main electrode, the second main electrode, and the auxiliary electrode.

2. The semiconductor device according to claim 1, wherein a region of the current path between the second main electrode and the auxiliary electrode is used as a current path shared by the transistor and the rectifier.

3. The semiconductor device according to claim 1, wherein a region of the current path between the third main electrode and the auxiliary electrode interposing the control electrode therewith is used as a current path of the transistor, and
a region of the current path between the first main electrode and the auxiliary electrode is used as a current path of the rectifier.

4. The semiconductor device according to claim 1, wherein the first main electrode and the third main electrode enclosed by the control electrode are alternately arrayed for two or more periods along the direction intersecting the current path.

5. The semiconductor device according to claim 1, wherein the first main electrode, the third main electrode and the auxiliary electrode are electrically connected to one another, and
the first main electrode, the third main electrode and the auxiliary electrode are set at a same potential.

6. The semiconductor device according to claim 1, wherein the transistor is a transistor using a two-dimensional electron gas channel as the current path,
the first main electrode is any one of a Schottky electrode arranged on the two-dimensional electron gas channel while interposing a compound semiconductor therebetween, a Schottky electrode directly connected to the two-dimensional electron gas channel, a composite electrode including a p-type semiconductor electrode and an ohmic electrode using a field effect, and a composite electrode including an n-type semiconductor electrode and an ohmic electrode using a field effect, and
the auxiliary electrode is either one of a p-type semiconductor electrode and a MIS-type electrode.

7. The semiconductor device according to claim 1, further comprising:
    a field plate electrically connected to the auxiliary electrode and set at a same potential as a potential of the auxiliary electrode, the field plate provided in a region of the current path between the auxiliary electrode and the second main electrode.

8. The semiconductor device according to claim 1, wherein The control electrode is arranged to enclose a periphery of the third main electrode.

* * * * *